(12) United States Patent
Mizokami et al.

(10) Patent No.: US 8,571,496 B2
(45) Date of Patent: Oct. 29, 2013

(54) SEMICONDUCTOR DEVICE FOR SIGNAL AMPLIFICATION

(75) Inventors: Masakazu Mizokami, Tokyo (JP);
Takaya Maruyama, Tokyo (JP);
Kazuaki Hori, Tokyo (JP)

(73) Assignee: Renesas Electronics Corporation, Kanagawa (JP)

(*) Notice: Subject to any disclaimer, the term of this patent is extended or adjusted under 35 U.S.C. 154(b) by 443 days.

(21) Appl. No.: 12/721,261

(22) Filed: Mar. 10, 2010

(65) Prior Publication Data
US 2010/0231305 A1 Sep. 16, 2010

(30) Foreign Application Priority Data

Mar. 12, 2009 (JP) ................................. 2009-059951

(51) Int. Cl.
*H01Q 11/12* (2006.01)
*H04B 1/04* (2006.01)

(52) U.S. Cl.
USPC .................... 455/127.2; 455/127.5; 330/277; 330/310

(58) Field of Classification Search
USPC ............. 455/127.1, 127.2, 127.3, 127.5, 574; 330/250, 277, 278, 310; 375/297
See application file for complete search history.

(56) References Cited

U.S. PATENT DOCUMENTS

| | | | | |
|---|---|---|---|---|
| 4,562,406 A | * | 12/1985 | Baker | 330/310 |
| 5,146,179 A | * | 9/1992 | Carley et al. | 330/277 |
| 5,917,380 A | | 6/1999 | Darthenay et al. | |
| 6,617,931 B2 | * | 9/2003 | Theus et al. | 330/310 |
| 7,999,615 B2 | * | 8/2011 | Litmanen et al. | 330/278 |

FOREIGN PATENT DOCUMENTS

| | | |
|---|---|---|
| JP | 10-70424 | 3/1998 |
| JP | 2001-036367 A | 2/2001 |
| JP | 2001036367 A * | 2/2001 |

OTHER PUBLICATIONS

Japanese Office Action, and English translation thereof, issued in Japanese Patent Application No. 2009-059951 dated Oct. 9, 2012.

* cited by examiner

*Primary Examiner* — Quochien B Vuong
(74) *Attorney, Agent, or Firm* — McDermott Will & Emery LLP

(57) ABSTRACT

A semiconductor device for transmitting-signal amplification which has a fine resolution, a high dynamic range, a small occupied area, and low power consumption, is realized. An input signal amplitude is reduced every one half by a ladder network, and a transconductance amplifier stage is arranged corresponding to each node of the ladder network. An output of the transconductance amplifier stage is coupled to an output signal line in common. According to a control word WC<21:0>, the transconductance amplifier stage is enabled selectively, and the output current which appears in the output signal line is added.

5 Claims, 31 Drawing Sheets

FIG. 2

| | 96dB wc<22> | 90dB wc<21> | | 12dB wc<8> | 6dB wc<7> | 0dB wc<6> | -6dB wc<5> | -12dB wc<4> | -18dB wc<3> | -24dB wc<2> | -30dB wc<1> | -36dB wc<0> | CALCULATED VALUE cal [dB] | IDEAL VALUE ideal [dB] | ERROR =cal−ideal |
|---|---|---|---|---|---|---|---|---|---|---|---|---|---|---|---|
| | $2^{16}$ | $2^{15}$ | | $2^{2}$ | 2 | 1 | $\left(\tfrac{1}{2}\right)$ | $\left(\tfrac{1}{2}\right)^{2}$ | $\left(\tfrac{1}{2}\right)^{3}$ | $\left(\tfrac{1}{2}\right)^{4}$ | $\left(\tfrac{1}{2}\right)^{5}$ | $\left(\tfrac{1}{2}\right)^{6}$ | | | |
| | 0 | 0 | | 0 | 0 | 1 | 0 | 0 | 0 | 0 | 0 | 0 | 0.000 | 0 | 0 |
| | 0 | 0 | | 0 | 0 | 1 | 0 | 0 | 0 | 0 | 0 | 1 | 0.137 | 0.125 | 0.012 |
| | 0 | 0 | | 0 | 0 | 1 | 0 | 0 | 0 | 0 | 1 | 0 | 0.270 | 0.25 | 0.020 |
| | 0 | 0 | | 0 | 0 | 1 | 0 | 0 | 0 | 0 | 1 | 1 | 0.403 | 0.375 | 0.028 |
| | 0 | 0 | | 0 | 0 | 1 | 1 | 0 | 0 | 1 | 0 | 0 | 0.531 | 0.5 | 0.031 |
| | 0 | 0 | | 0 | 0 | 1 | 1 | 1 | 0 | 1 | 0 | 1 | 0.660 | 0.625 | 0.035 |
| | 0 | 0 | | 0 | 0 | 1 | 1 | 1 | 1 | 1 | 1 | 1 | 5.833 | 5.75 | 0.083 |
| | 0 | 0 | | 0 | 1 | 1 | 1 | 1 | 1 | 1 | 1 | 0 | 5.902 | 5.875 | 0.027 |
| | 0 | 0 | | 0 | 1 | 0 | 0 | 0 | 0 | 0 | 0 | 0 | 6.000 | 6 | 0.000 |
| | 0 | 0 | | 0 | 1 | 0 | 0 | 0 | 0 | 0 | 1 | 0 | 6.137 | 6.125 | 0.012 |
| | 0 | 0 | | 0 | 1 | 0 | 0 | 0 | 0 | 1 | 1 | 0 | 6.270 | 6.25 | 0.020 |
| | 0 | 0 | | 0 | 1 | 0 | 0 | 0 | 0 | 1 | 1 | 0 | 6.403 | 6.375 | 0.028 |

S1: $\sin(\omega t)$, S3: $2\sin(\omega t)$
S2: $\sin(\omega t + \theta)$, S4: $\sin(\omega t) + \sin(\omega t + \theta)$ V1=BBI−BBIB=BBQ−BBQB
LO FIXED VALUE: { LOI=LOQ=H & LOIB=LOQB=L
or
LOI=LOQ=L & LOIB=LOQB=H

SEMICONDUCTOR DEVICE FOR SIGNAL AMPLIFICATION

CROSS REFERENCES TO RELATED APPLICATIONS

The disclosure of Japanese Patent Application No. 2009-59951 filed on Mar. 12, 2009 including the specification, and drawings and abstract is incorporated herein by reference in its entirety.

BACKGROUND OF THE INVENTION

The present invention relates to a semiconductor device for signal amplification, in particular, relates to a configuration of a transmission amplifying device for controlling gain of a transmitting signal of a transmitting section in mobile communications equipment.

As a communications system to a mobile terminal etc. in a mobile communications field, there is currently UMTS (Universal Mobile Telecommunications System; European standard communications system: compatible with W-CDMA in Japan). UMTS has spread widely as a communications system of a third-generation digital mobile-phone.

In the UMTS transmission system, a power control range is 86 dB and a high dynamic range is required. In order to respond to such a high dynamic range, gain is usually controlled by plural stages of amplifiers. However, when the number of stages of amplifiers increases, a noise of each amplifier is amplified, resulting in an increased total noise. In a mobile terminal, miniaturization of a package is required for reduction of a device mounting surface area, and removal of a SAW (surface acoustic wave) filter for denoising is required. Such a configuration requires an amplifier to exhibit a characteristic with a severe noise specification.

A variable gain resolution required by a base station is 1 dB at an antenna end. In order to satisfy the requirement, a very fine step of gain, 0.25 dB, is required as resolution inside an RF-IC which generates a high-frequency signal. In the UMTS transmission system, a power consumption is large compared with a receiving system, and it is required that LO leakage (leakage current consumed from a DC power supply at the time of no high-frequency signal input) should be suppressed. As a countermeasure to suppress the LO leakage at the time of a low power output, the gain of a high-frequency unit is usually controlled and the LO leakage is suppressed accordingly.

Patent Document 1 (Japanese Unexamined Patent Publication No. Hei 10 (1998)-70424) discloses an example of a configuration of a variable gain amplifier. In the variable gain amplifier disclosed by Patent Document 1, plural transconductance amplifiers are arranged in series and coupled to an input terminal in common. Each output terminal of the transconductance amplifiers is coupled to a voltage dividing node of an R-2R ladder resistor network via a switching element. The switching element is set to on or off by the corresponding bit of a control word C<N−1:0>. An output terminal of an adjoining transconductance amplifier is coupled via a series resistance R of the R-2R ladder resistor network. The transconductance amplifiers are coupled with constant current sources, respectively, and currents outputted from the transconductance amplifiers are shunted by the R-2R ladder resistor network, and supplied to the output terminal of the amplifier. By the shunt effect of the series-coupled resistor R, a weight of (½) is attached to the output currents of the transconductance amplifiers, and the gain is directly controlled by a total current produced according to a binary digital code of binary digits of the control word C(0), C(1), . . . , C(N−1)=C<N−1:0>.

(Patent Document 1) Japanese Unexamined Patent Publication No. Hei 10 (1998)-70424

SUMMARY OF THE INVENTION

Patent Document 1 aims for removing the necessity of converting the control word into an analog signal, by controlling the output voltage level of the amplifier according to the control word, and correspondingly, aims for suppressing superposition of an error in the control word conversion to the output voltage of the amplifier.

However, according to the configuration of Patent Document 1, when all control word bits C(0)-C(N−1) are "1" (H level), all the transconductance amplifiers flow current via the output load; therefore, the consumption current becomes very large. Further, the current flows to the output end of the circuit via the shunt resistors (series resistance R), to generate the output voltage. Therefore, to the output signal, contribution of the signal current of a transconductance amplifier controlled by an upper control word bit is larger, and contribution of the signal current of a transconductance amplifier controlled by a lower control word bit is smaller. Therefore, there arises a problem that power efficiency is poor and gain controllability deteriorates at the time of generating a high output voltage.

In mobile terminal equipment, such a gain variable amplifier is utilized as a high-frequency power amplifier in a transmission system. To the high-frequency power amplifier, an open-drain output configuration is used usually and an impedance matching circuit is formed externally. Ideally, an output power generated by the power amplifier is stored by the impedance matching circuit. Therefore, the configuration in which the output voltage is generated by using the resistor network as a load, such as in Patent Document 1, can not be applied to such an amplifier of the open-drain configuration.

The present invention has been made in view of the above circumstances and provides a semiconductor device for signal amplification which has a high dynamic range, a fine resolution, a small occupied area, and low power consumption.

The present invention also intends to provide a semiconductor device for transmitting-signal amplification, which has a high-frequency power amplifier applicable to mobile terminals, such as a mobile-phone.

A semiconductor device for signal amplification according to the present invention includes a ladder network which has plural cascade-coupled nodes, plural first transconductance stages arranged corresponding to each node of the ladder network, and a logic control circuit which sets the first transconductance stages to an enabled state selectively according to a control word.

In the ladder network, an input signal supplied to an input node is transmitted to each node. Each node of the ladder network is weighted corresponding to the individual position in the ladder network, and generates a signal of amplitude corresponding to the attached weight. The first transconductance stage, when enabled, converts voltage at the corresponding node of the ladder network into current, and transmits the current to an output signal line arranged in common. The logic control circuit sets the first transconductance stages to an enabled state selectively according to the control word.

Voltage levels of each node of the ladder network are different; correspondingly, voltage levels supplied to each of the first transconductance stages are different. The output signal line is provided common to the first transconductance stages. The present first transconductance stages are selectively enabled according to the control word. It is possible to set the current step which appears in the output signal line to any value, leading to realization of gain of fine resolution. It is also possible to make the dynamic range high by increasing the number of the first transconductance stages. The number of the first transconductance stages enabled at the same time is reduced, and the consumption current can be reduced.

BRIEF DESCRIPTION OF THE DRAWINGS

FIG. 2 is a drawing illustrating a list of correspondence of gain control and a control word according to Embodiment 1 of the present invention;

FIG. 22 (B) is a drawing illustrating behavior of an in-transmission average current and an occupied area as a function of the number of the parallel amplifier stages coupled to an input node of the variable gain driver;

FIG. 22 (C) is a drawing illustrating relationship between the number of the parallel amplifier stages coupled to the input node of the variable gain driver and receiving band noise;

DETAILED DESCRIPTION OF THE PREFERRED EMBODIMENTS

Embodiment 1

Figure 1:
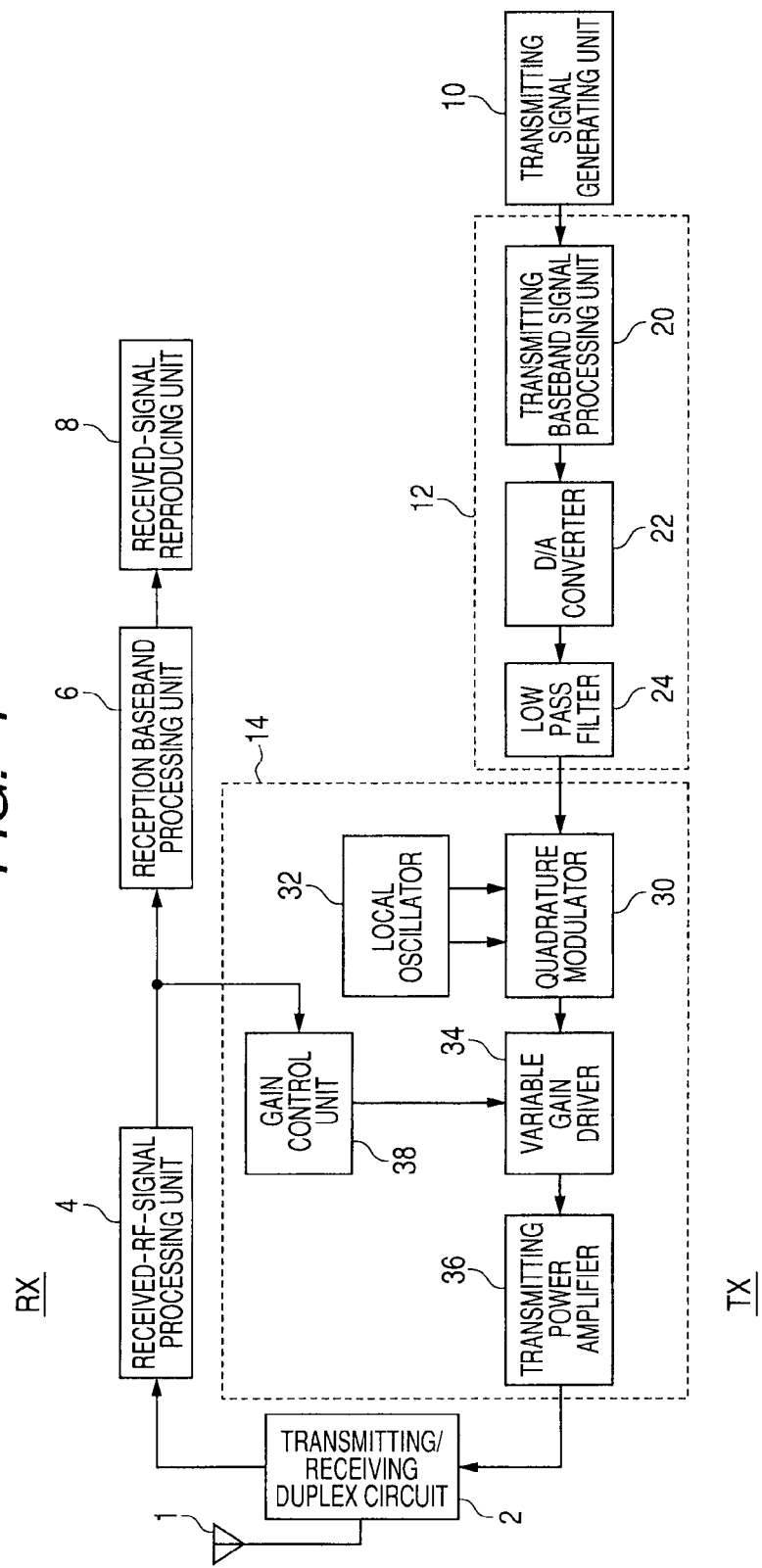
FIG. 1 is a drawing illustrating schematically an entire configuration of a communication terminal to which the present invention is applied.

FIG. 1 illustrates schematically an entire configuration of a mobile terminal including a semiconductor device for signal amplification according to Embodiment 1 of the present invention. In FIG. 1, the mobile terminal includes a reception path RX which receives and reproduces a signal supplied via an antenna 1, a transmitting path TX which transmits a signal/data via the antenna 1, and a transmitting/receiving duplex circuit 2 which couples the transmitting path TX and the reception path RX to the antenna 1. The present mobile terminal performs communication according to UMTS, employs an FDD system as the communications system, and performs transmission and reception in parallel on a full-duplex transmission system, by allocating different frequency bands to transmission and reception. The transmitting/receiving duplex circuit 2 performs transmission and reception in parallel to the antenna 1 using different frequency bands.

The transmitting/receiving duplex circuit 2 includes a duplexer which separates a transmitting signal and a reception signal and prevents the transmitting signal from interfering in the reception signal.

The reception path RX includes a received-RF-signal processing unit 4 which processes a high-frequency signal (RF signal), a reception baseband processing unit 6 which processes a baseband signal, and a received-signal reproducing unit 8 which reproduces a reception signal. The received-RF-signal processing unit 4 performs demodulation of the high-frequency signal supplied from the transmitting/receiving duplex circuit 2, and generates an analog baseband signal.

The reception baseband processing unit 6 performs a process necessary for reproduction, after converting the analog baseband signal supplied from the received-RF-signal processing unit 4 into a digital signal. According to the reception signal generated by the reception baseband processing unit 6, the received-signal reproducing unit 8 reproduces the reception signal through the use of a speaker, a display unit, etc.

The transmitting path TX includes a transmitting signal generating unit 10, a transmission baseband processing unit 12 which generates a baseband signal for transmission, and a transmitting-RF-signal processing unit 14 which generates a high-frequency signal for transmission (RF signal). The transmitting signal generating unit 10 selects a transmitting mode according to control information inputted from a keypad or a touch panel, and generates the transmitting signal/data, such as an audio signal inputted from a microphone, or text data inputted from a keypad.

Transmission baseband processing unit 12 includes a transmitting baseband signal processing unit 20, a D/A converter 22, and a low pass filter 24. The transmitting baseband signal processing unit 20 performs digital processing of the transmitting baseband signal generated by the transmitting signal generating unit 10. The D/A converter 22 converts a digital signal from the transmitting baseband signal processing unit 20 into an analog signal. The low pass filter 24 removes a high-frequency component (noise component) of the analog signal converted by the D/A converter 22.

The transmitting baseband signal processing unit 20 generates a digital base band signal by converting the transmitting signal/data generated by the transmitting signal generating unit 10 into a form suited for specified transmission. The D/A converter 22 converts the digital base band signal from the transmitting baseband signal processing unit 20 into an analog signal. The low pass filter 24 removes a high-frequency noise component produced in the D/A converter 22 and performs waveform shaping. Then an analog baseband signal is generated.

Transmitting-RF-signal processing unit 14 includes a quadrature modulator 30, a variable gain driver 34, and a transmitting power amplifier 36. According to an oscillation signal from a local oscillator 32, the quadrature modulator 30 performs quadrature modulation of the baseband signal supplied from the low pass filter 24 of the transmission baseband processing unit 12. The variable gain driver 34 amplifies a modulated signal generated by the quadrature modulator 30. The transmitting power amplifier 36 amplifies further a signal generated by the variable gain driver 34.

The local oscillator 32 generates an oscillation signal (LOI and LOQ) used as a carrier which has a constant frequency. As an example, the quadrature modulator 30 performs IQ modulation and generates a modulated signal of I component (in-phase component) and Q component (quadrature component) from the baseband signal supplied by the low pass filter 24.

Under the control of a gain control unit 38, the gain of the variable gain driver 34 is set to a level suitable for transmission, and the variable gain driver 34 amplifies a modulated signal outputted by the quadrature modulator 30. The transmitting power amplifier 36 amplifies, with a fixed gain, the signal which has been amplified by the variable gain driver 34 with the adjusted gain, and transmits the amplified signal to the antenna 1 via the transmitting/receiving duplex circuit 2.

The gain control unit 38 adjusts the gain of the variable gain driver 34 according to the level of a reception signal from the received-RF-signal processing unit 4 and a gain control bit included in a control word supplied from a base station. Correspondingly, the gain control unit 38 adjusts the transmission level, depending on distance between the base station and the mobile terminal concerned.

In the mobile terminal illustrated in FIG. 1, a direct conversion system is utilized and conversion using an intermediate frequency (IF) component is not performed, but a modulated signal generated by the quadrature modulator 30 is amplified by the variable gain driver 34 and transmitted directly. Therefore, an oscillation signal of the local oscillator 32 has the same frequency as that of the reception signal supplied via the antenna 1, and the present oscillation signal is utilized as a carrier for transmission. In the present invention, transmission power control is performed by the variable gain driver 34 in the preceding stage of the transmitting power amplifier 36, accordingly, the number of stages of amplifiers is reduced and noise is reduced.

FIG. 2 illustrates a list of relationship between the control word for performing the gain control and the gain of the variable gain driver 34 illustrated in FIG. 1. In FIG. 2, 22-bit control words wc<21>-wc<0> are utilized for the gain control. Weight is allocated to each bit in units of 6 dB from −36 dB to 90 dB. FIG. 2 also shows the gain allocated to each bit. For example, −36 dB corresponds to the gain of (½)^6. Here, the symbol "^" indicates exponentiation. The minimum step of gain is 0.125 dB.

In FIG. 2, although a control word bit of 96 dB is listed, 96 dB is specified by the control word bit wc<21> corresponding to 90 dB and the lower 6-bit control words. Therefore, in the following description of embodiments, 22-bit control words wc<21:0> are utilized for the gain control. However, when a dynamic range required is expanded, the number of control word bits utilized will also correspondingly increase.

Plural gains each specified by a control word bit in 6 dB steps are added to specify a required gain (addition by current is performed as explained later). That is, gains indicated by "1" in the control word bits wc<21>-wc<0> illustrated in FIG. 2 are added. To the gain of 0 to −36 dB, 7-bit control words wc<6>-wc<0> are utilized. The control word bit wc<6> corresponding to 0 dB is set to "1", the control word bits wc<5>-wc<0> allocated from −6 dB to −36 dB are selectively set to "1", and the gain from 0 dB to 6 dB is expressed in 0.125 dB steps.

For example, when the output gain is specified as 0.125 dB, control word bits wc<6> and wc<0> are both set to "1", and the remaining control word bits wc<5>-wc<1> are altogether set to "0." In the present case, addition of the current values expressed with the respective dBs is performed, accordingly, the gain is set to 1+1/64=65/64 by the current addition of the gain of 0 dB and −36 dB, obtaining 0.137 dB from 20 log(65/64). As a result, the ideal value of 0.125 dB can be obtained approximately.

Similarly, in order to obtain the output gain of 0.375 dB, control word bits wc<6>, wc<1>, and wc<0> are set to "1", and the specified gains are added. Namely, by adding −30 dB and −36 dB to 0 dB, the gain is set to 20 log(67/64)=0.403 dB. As a result, the ideal value of 0.375 dB can be obtained approximately.

Therefore, an approximate value of gain up to 5.875 dB is approximately generated in 0.125 dB steps, by combining seven values of 6 dB steps from the gain of 0 dB to −36 dB with the use of a binary representation of control word bits wc<6>-wc<0>.

To the gain of 6 to 12 dB, one-bit upper shift (arithmetic left shift) is performed, and control word bits wc<7>-wc<1> are utilized. Also in the present case, the control word bit wc<7> is fixed to "1", and the remaining control word bits are incremented by one in a binary representation, then, similarly, the gain can be adjusted in 0.125 dB steps. When the gain is further increased, the bit location of the control word is correspondingly shifted in the upper direction, and 7-bit control words are similarly incremented by one in a binary representation. Accordingly, the gain is increased in a minimum gain step and the required gain can be expressed.

Here, in the configuration of expressing a range of 0 to 6 dB in 0.125 dB steps, the highest control word bit wc<6> corresponding to the minimum gain of 0 dB is fixed to "1", and an incremental value of the gain is expressed by lower control word bits wc<5>-wc<0>. In the present case, six bits of the control word bits can be utilized, and in the case of 0.125 dB steps, 47 (=6/0.125) steps can be expressed (in the case of an ideal value "ideal"). However, the calculated value is larger than the ideal value of 0.125 dB, and the gain step differs from 0.125 dB. Therefore, in the expression in which the gain is incremented by "1" in a binary code, all the combination of control word bits is not used. As illustrated in FIG. 2, for example, a control word bit which gives the gain of a calculated value of 5.902 dB becomes wc<6:0>=(1111110).

By adjusting the number of control word bits to use, gain can be expressed in arbitrary steps. For example, in the case of expressing gain in 0.5 dB steps, control word bits wc<6>-wc<2> are used. Since gain is incremented by binary code representation also in the present case, the gain can be changed in 0.5 dB steps by incrementing the lower bits wc<5>-wc<2> by "1" in the binary code representation, in the same manner as in the above-described case where the control word bits wc<6>-wc<0> are used.

Finally, seven bits of the control word bits wc<21>-wc<15> (not shown) are used for expressing gain from 90 dB to 96 dB. It is possible to increment the gain from 90 dB to 96 dB in 0.125 dB steps, by specifying gain of 90 dB by specifying the control word bit wc<21> as "1", and by changing six bits of the remaining control word bits wc<20>-wc<15> in the binary code representation sequentially.

Gain of the variable gain driver 34 is changed according to control from the gain control unit 38 by expressing the gain in terms of the control word bit and changing it sequentially in a predetermined step.

In the present expression, as illustrated in FIG. 2, due to a difference between the calculated value "cal" and the ideal value "ideal", an error "cal-ideal" exists; therefore, it is necessary to cancel the error. As illustrated in FIG. 2, the control word bits wc<6>-wc<0> are incremented by "1" in binary representation, an error "cal-ideal" between the calculated value "cal" and the ideal value "ideal" exists, and, in a semi-logarithmic graph expressing dB, the dB value does not change linearly in proportion as a control word. Therefore, in order to ensure consistency between the control word bits wc<21>-wc<0> in a binary code, and the linear representation of dB obtained by logarithmic calculation, that is, in order that a value of the control word specifies gain (dB) which changes linearly, it is necessary to perform code conversion so that correspondence of the control word and the dB value may be changed.

Figure 3:
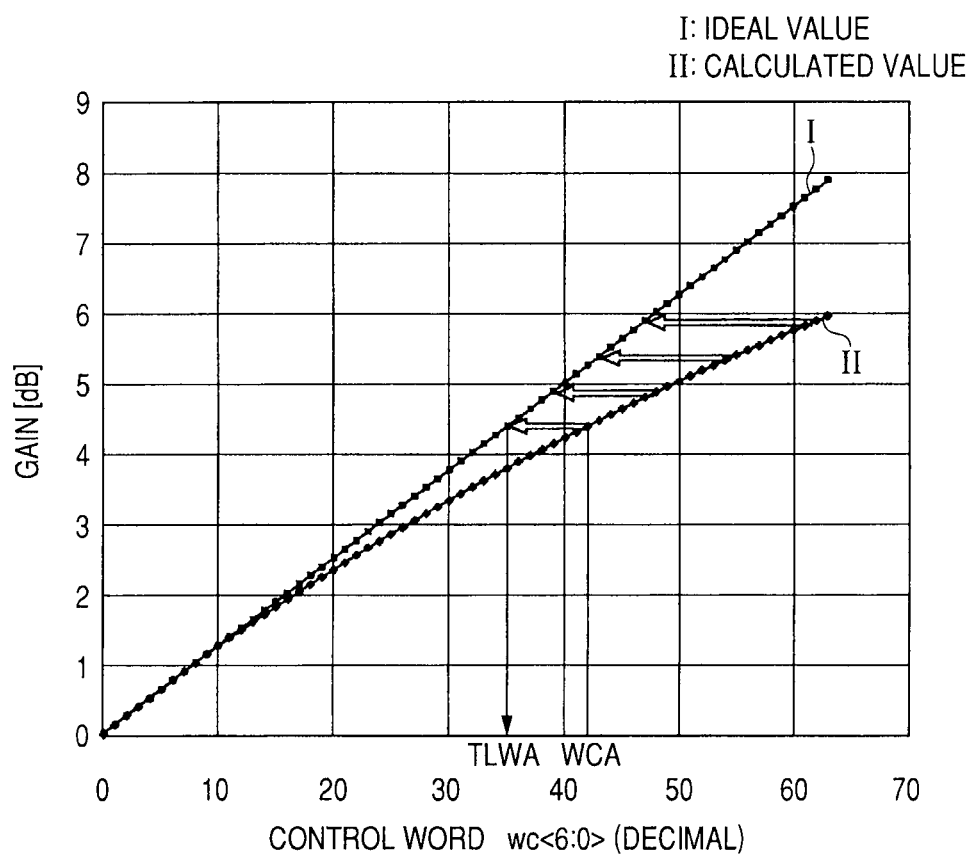
FIG. 3 is a drawing illustrating schematically a mode of converting the calculated value into the ideal value illustrated in FIG. 2.

FIG. 3 illustrates schematically a conversion mode of a control word which controls the gain of the variable gain driver according to Embodiment 1 of the present invention. In FIG. 3, a decimal value of the control word wc<6:0> is shown in the horizontal axis and the gain (dB) is shown in the vertical axis. A straight line I is an ideal value and a curve II is a calculated value.

In FIG. 3, when a control word WCA is represented in a binary code, a value on the curve II is specified as the corresponding gain. In the present case, the value is different from an ideal value shown by the straight line I; therefore, it is necessary to convert into a value on the ideal straight line I including an error. In the conversion, the control word WCA is converted into a control word TLWA so as to specify the gain on the ideal straight line I corresponding to the gain on the curve II specified by the control word WCA. Accordingly, the control word WCA is described to increment by "1" in a binary code sequentially, and the binary code is converted into the control word TLWA which changes the gain linearly in 0.125 dB steps. Consequently, the gain is changed linearly.

A table memory is used for the present code conversion, for example. That is, as an example, using a binary-coded control word as an address of the table memory, a binary code which specifies the corresponding gain is stored to each address. A binary-coded control word wc<21:0> is stored in a memory, such as a register file. Using the binary-coded control word read from the memory as an address, the table memory is accessed and the corresponding code is read. The code read is used as the conversion control word TLWA. Accordingly, the gain of the variable gain driver can be linearly changed using the control word of the binary code representation illustrated in FIG. 2.

Figure 4:
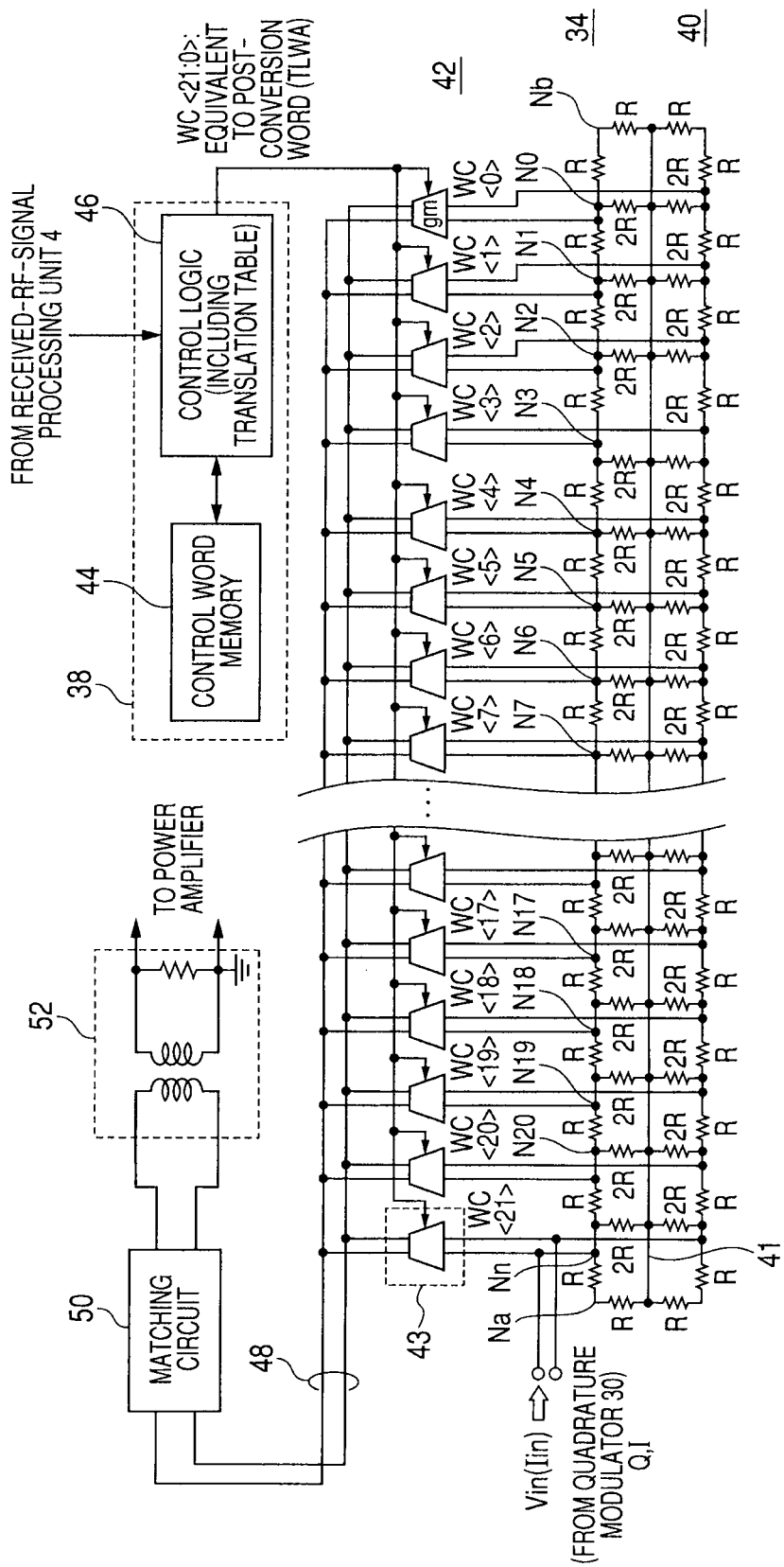
FIG. 4 is a drawing illustrating schematically a configuration of a variable gain driver according to Embodiment 1 of the present invention.

FIG. 4 illustrates schematically a configuration of the variable gain driver 34 and the gain control unit 38, illustrated in FIG. 1. In FIG. 4, the configuration of an impedance matching unit provided between the variable gain driver 34 and the transmitting power amplifier 36 is also illustrated.

In FIG. 4, the variable gain driver 34 includes an R-2R ladder network 40 which performs the resistive subdivision of the input signal Vin, and a voltage/current conversion unit 42 which converts voltage at each node of the ladder network 40 into current according to the control word WC<21:0> and supplies the current to an output signal line 48. The voltage/current conversion unit 42 includes a transconductance amplifier stage 43 provided corresponding to each node of the R-2R ladder network 40.

The R-2R ladder network 40 includes a resistance element R coupled in series between nodes Na and Nb, and a shunt resistance element 2R coupled in parallel between an AC grounding conductor 41 and each of the nodes Na and Nb, the input node Nn, and voltage dividing nodes N(n−1)−N0. The resistance element R has a value of resistance R and the shunt resistance element 2R has a value of resistance 2R, respectively. Here, the resistance element and its value of resistance are indicated by the same reference symbol.

The R-2R ladder network 40 generates, to each node, voltage which is obtained by resistive subdivision of the AC input signal Vin (input current In) on the basis of an AC grounding conductor 41.

The voltage/current conversion unit 42 sets to an enabled state selectively the transconductance amplifier 43 provided to the input node Nn and the voltage dividing nodes N(n−1)−N0, according to the control word WC<21:0> from the gain control unit 38, and generates a current signal on the output signal line 48. The transconductance amplifier stage 43 is enabled when the corresponding control word bit is "1", and converts voltage at the corresponding node of the ladder network 40 into current.

The gain control unit 38 includes a control word memory 44 which stores the control word wc<21:0>, and a control logic 46 which generates a post-conversion control word WC<21:0>. According to a received-signal-level detecting signal from the received-RF-signal processing unit 4 or a gain control bit included in the reception signal, the control logic 46 reads and converts the corresponding control word from the control word memory 44, and generates the post-conversion control word WC<21:0>. In FIG. 4, the post-conversion control word WC<21:0> is illustrated. The present post-conversion control word WC<21:0> corresponds to the control word TLWA after conversion illustrated in FIG. 3, for example. According to the control word WC<21:0> from the control logic 46, the transconductance amplifier stage 43 is selectively set to ON state (enabled state) in units of a 7-bit control word, and a current signal corresponding to a signal obtained after amplifying the input signal Vin or the input current In is generated on the output signal line 48. By arranging the output signal line 48 in common to the transconductance amplifier 43, it is possible to add current which the enabled transconductance amplifier 43 generates, accordingly, it is possible to generate a signal having the gain specified by the control word. A transconductance amplifier which forms each transconductance amplifier stage 43 has the same transconductance $\mu m$ and the same configuration.

An output signal of the variable gain driver 34 is transmitted to the transmitting power amplifier in the following stage via a matching circuit 50 and a high-frequency transformer circuit 52. The matching circuit 50 matches an output impedance of the variable gain driver 34 with an input impedance of the transformer circuit 52. The high-frequency transformer circuit 52 separates a DC component between the variable gain driver 34 and the high-frequency transmitting power amplifier in the following stage, and also performs impedance conversion therebetween. By the action of the matching circuit 50 and the high-frequency transformer circuit 52, matching of the output impedance of the variable gain driver 34 and the input impedance of the transmitting power amplifier is established.

A combined resistance R is coupled to each of the nodes Nn-N0 in the R-2R ladder network 40. It is now explained that the combined resistance of each node is all R, using a simplified resistor ladder network illustrated in FIG. 5.

Figure 5:
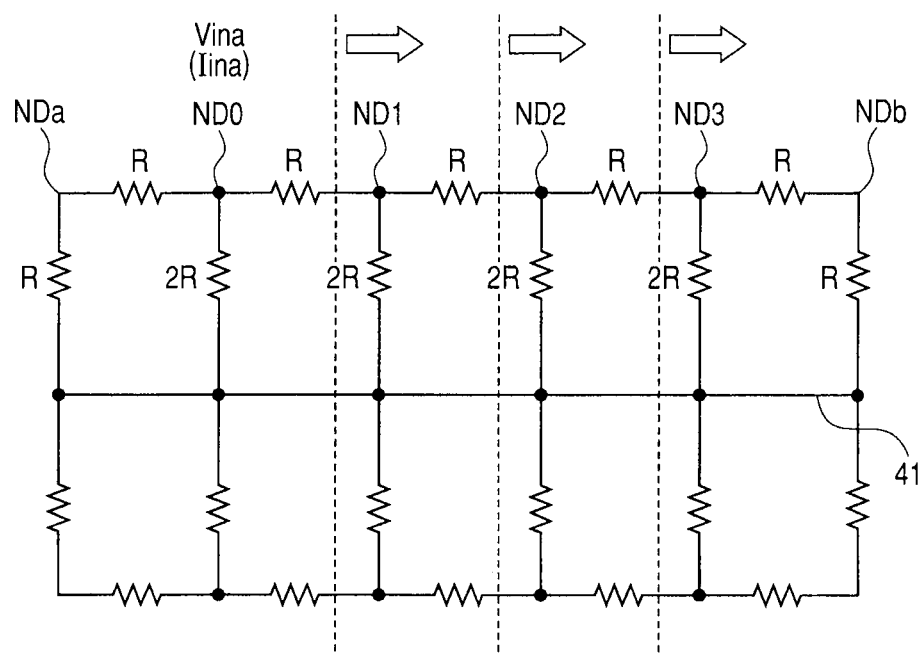
FIG. 5 is a drawing for explaining a value of resistance of a node of an R-2R ladder network illustrated in FIG. 4.

FIG. 5 explains a resistive subdivision mode of an R-2R ladder network illustrated in FIG. 4. In FIG. 5, five resistance elements R are coupled in series between a node NDa and a node NDb; a shunt resistance element 2R is coupled between each of nodes ND0-ND3 and an AC grounding conductor 41; and a resistance element R is coupled between the node NDa and the AC grounding conductor 41, and between the node NDb and the AC grounding conductor 41. It is now assumed that an input voltage Vina (input current Iina) is supplied to the node ND0. In the present case, as for the node ND3, resistors 2R and 2R are coupled in parallel, resulting in a combined resistance of R. Accordingly, as for the node ND2, resistors 2R and 2R are coupled in parallel, because a resistor R is coupled to the node ND3, resulting in a combined resistance of R. Also as for the node ND1, resistors 2R and 2R are coupled in parallel, because a resistor R is coupled to the node ND2, resulting in a combined resistance of R.

Accordingly, in each of the node ND1 to the node ND3, the combined resistance when observed in an arrow direction as illustrated in FIG. 5 becomes R. As for the node ND1, the situation becomes equivalent to a case where a resistor R is coupled between the node ND1 and the node NDb. Therefore, when the input voltage signal Vina is supplied to the node ND0, a voltage of one half of the input voltage, Vina/2, appears at the node ND1. As for the node ND2, since the combined resistance R is coupled between the node ND2 and the node NDb, a voltage of one half of the voltage at the node ND1, Vina/4, appears at the node ND2. Similarly, a voltage of one half of the voltage of the node ND2, Vina/8, appears at the node ND3.

As for the node ND0, resistors 2R are coupled in three directions, accordingly, the combined resistance becomes 2R/3. Accordingly, as for the node ND0, when the input current is assumed to be Iin, the input voltage Vina becomes (2R/3)·Iina.

The ladder network 40 illustrated in FIG. 4 has a similar relationship of distribution of resistors. Accordingly, in the R-2R ladder network 40 illustrated in FIG. 4, when the input current is assumed to be In, a voltage Vin which appears at the input node Nn is expressed by In·2R/3, a voltage at each node is reduced every one half, in the direction from the node Nn to the node N0. Accordingly, at each node, a voltage with weighting of two appears, based on the voltage at the node N0.

The transconductance amplifier stage 43 converts the voltage at the corresponding node into a current signal, and transmits the current signal to the common output line 48. Therefore, current which the transconductance amplifier stage 43 supplies becomes the amount of current attached with weighting of two, and a current signal with amplitude allocated to each control word bit is supplied to the output signal line 48. Correspondingly, by adjusting a bit value of the control word WC<21:0>, a gain control in 0.125 dB steps for example, can be realized. The input voltage signal Vin is a high-frequency AC signal, and is subdivided to an upper resistor path and a lower resistor path in the resistor ladder network 40. The voltage difference between the upper resistor path and the lower resistor path acts as the input voltage to the corresponding transconductance amplifier stage.

As described above, in the R-2R ladder network 40, a voltage amplitude at a node Ni becomes one half of the voltage amplitude at a node N(i+1). Accordingly, transconductance of the corresponding transconductance amplifier stage 43 becomes twice as large as that of a transconductance amplifier stage 43 arranged on the right-hand side. On the contrary, the transconductance of the corresponding transconductance amplifier stage 43 becomes one half (−6 dB) of the transconductance of a transconductance amplifier stage arranged on the left-hand side.

Accordingly, in the voltage/current conversion unit 42, the gain step of the transconductance amplifier stage 43 arranged corresponding to each node of the R-2R ladder network 40 becomes equivalent to a 6-dB step. By enabling/disabling the corresponding transconductance amplifier stage selectively through the adjustment of the bit value of the control words WC<n>-WC<0>, it is possible to realize addition of transconductance of each transconductance amplifier stage on the common output signal line 48. By enabling plural transconductance amplifier stages 43 at the same time, it is possible to realize a power control with a fine resolution and a high dynamic range.

Figure 6:
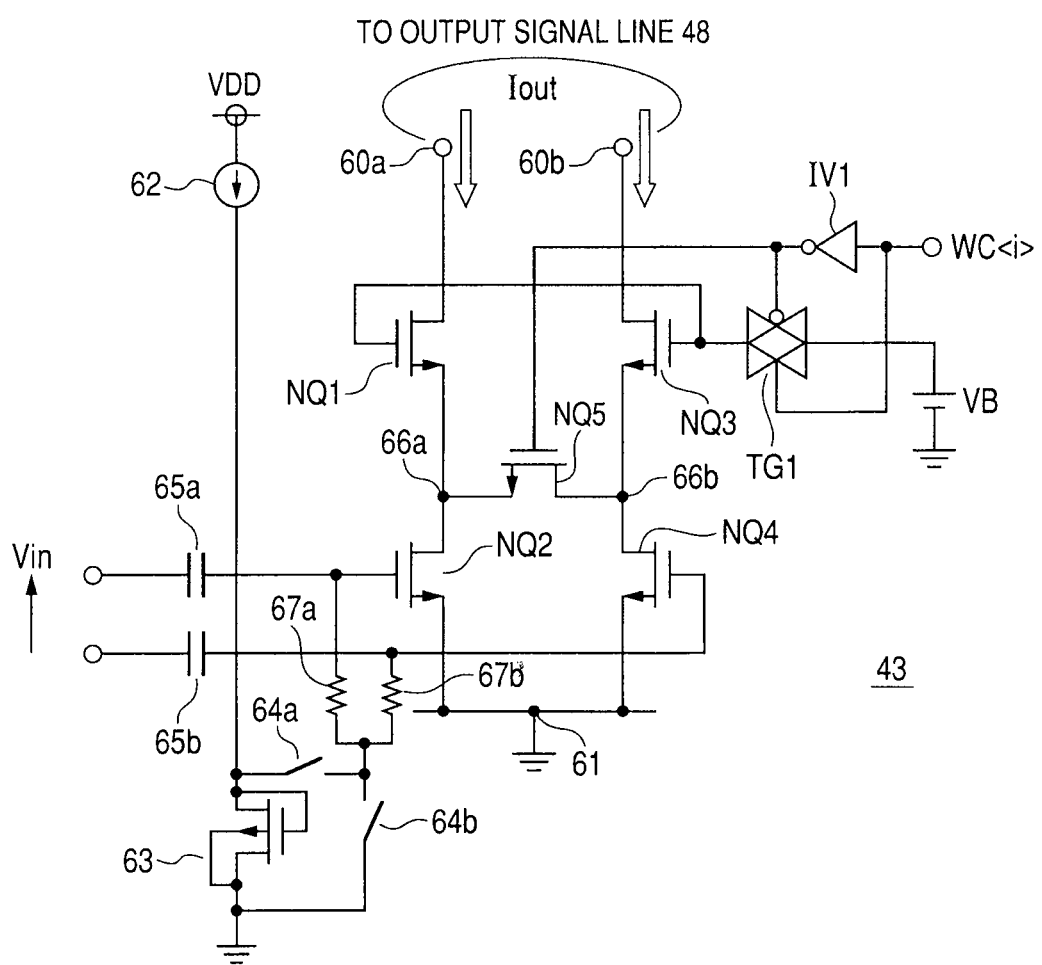
FIG. 6 is a drawing illustrating schematically a configuration of a transconductance amplifier stage illustrated in FIG. 4.

FIG. 6 illustrates an example of a configuration of the transconductance amplifier stage (gm stage) illustrated in FIG. 4. In FIG. 6, the transconductance amplifier stage 43 includes N-channel MOS transistors (insulated-gate field effect transistors) NQ1 and NQ2 coupled in series between an output node 60a and an AC ground node 61, and N-channel MOS transistors NQ3 and NQ4 coupled in series between an output node 60b and the AC ground node 61.

An input signal Vin is supplied to the gates of the N-channel MOS transistors NQ2 and NQ4, via capacitive elements 65a and 65b respectively. A high-frequency component of the input voltage Vin is transmitted to the gates of the MOS transistors NQ2 and NQ4 through the capacitive elements 65a and 65b. A bias voltage VB from a bias power supply VB is supplied to the gates of the N-channel MOS transistors NQ1 and NQ3, via a CMOS transmission gate TG1. Here, the same reference symbol VB is used to indicate the bias power supply and the bias voltage.

The transmission gate TG1 is selectively conducted according to a control word bit WC<i> and an inverted signal of the control word bit WC<i> supplied via an inverter IV1. Therefore, when the control word bit WC<i> is "1", the transmission gate TG1 is conducted, and the MOS transistors NQ1 and NQ3 function as a current limiting element.

The transconductance amplifier stage 43 includes further an N-channel MOS transistor NQ5 coupled between a connection node 66a of the MOS transistors NQ1 and NQ2, and a connection node 66b of the MOS transistors NQ3 and NQ4. The gate of the N-channel MOS transistor NQ5 receives the inverted signal of the control word bit WC<i> via the inverter IV1. The output nodes 60a and 60b are coupled to the output signal line 48 illustrated in FIG. 4, respectively.

In order to supply the DC bias to the gates of the MOS transistors NQ2 and NQ4, a constant current source 62, an N-channel MOS transistor 63, and bias resistance elements 67a and 67b are provided. The gate and the drain of the MOS transistor 63 are intercoupled, and the MOS transistor 63 converts current supplied from the constant current source 62 into voltage. The bias resistance elements 67a and 67b transmit the voltage generated by the MOS transistor 63 to the gates of the MOS transistors NQ2 and NQ4 via a switch 64a. The bias resistance elements 67a and 67b also have a function of high-frequency separation to prevent the high-frequency component from leaking to the gate and the drain of the MOS transistor 63. The gate voltage of the MOS transistors NQ2 and NQ4 is DC-biased by the voltage generated by the MOS transistor 63.

A switch 64b is provided between the bias resistance elements 67a and 67b and the ground node. The switch 64a is selectively conducted according to an operation mode control signal (not shown). When conducted, the switch 64a transmits the voltage generated by the MOS transistor 63. The switch 64b is selectively conducted in a similar manner according to the operation mode control signal (not shown). When conducted, the switch 64b couples the bias resistance elements 67a and 67b to the ground node; correspondingly, the gates of the MOS transistors NQ2 and NQ4 are set to the ground voltage level, and the MOS transistors NQ2 and NQ4 are set to OFF state.

In the transconductance amplifier stage 43 illustrated in FIG. 6, when the control word bit WC<i> is "1", the transmission gate TG1 is conducted, the N-channel MOS transistor NQ5 is in OFF state, and the N-channel MOS transistors NQ1 and NQ3 are in ON state. The MOS transistors NQ1 and NQ3 receive the bias voltage VB at the gates, and flow current of a constant magnitude according to the conductance set up by the bias voltage VB.

On the other hand, the MOS transistors NQ2 and NQ4 discharge the current to the AC ground node 61 according to the input signal (voltage) Vin supplied via the capacitive elements 65a and 65b. When the amplitude of the input signal voltage Vin is large, a difference of currents which flow through the MOS transistors NQ2 and NQ4, respectively, becomes large, and the output current Iout becomes large. When the amplitude of the input signal voltage Vin is small, a difference of currents which flow through the MOS transistors NQ2 and NQ4, respectively, becomes small, and correspondingly the output current Iout becomes small. Accordingly, the magnitude of the output current Iout changes corresponding to the amplitude of the input signal voltage Vin, and the conversion coefficient (gain) is set up corresponding to the transconductance gm of the MOS transistors NQ2 and NQ4.

Accordingly, when the control word bit WC<i> is "1" and the transconductance amplifier stage 43 is in a selected state, the output current Iout corresponding to the amplitude of the input signal voltages Vin is supplied to the output signal line 48.

When the control word bit WC<I> is "0" and the transconductance amplifier stage 43 is in a not-selected state on the other hand, the MOS transistor NQ5 is in ON state, and the transmission gate TG1 is in a cut-off state. In the present case, the internal nodes 66a and 66b are short-circuited by the MOS transistor NQ5, and the voltages at the internal nodes 66a and 66b are equalized. Therefore, the transconductance amplifier stage 43 in a not-selected state does not produce current difference at the output nodes 60a and 60b, consequently, the output current Iout is set to zero. Accordingly, it is prevented that a leakage current of the transconductance amplifier stage in a not-selected state has influence to current of the output signal line 48. Preventing the influence of the leakage current is specifically based on the following reasons.

In the UMTS transmission system, it is required that power control is performed over a range of not less than 86 dB, and the output power is changed from 0.25 mW to 2.5 mW. In the case of a low output current, the output current of a transconductance amplifier stage in an enabled state (selected state) is small. At this time, a leakage current of a transconductance amplifier stage in a disabled state (not-selected state) is supplied to the output signal line 48 via the output terminals 60a and 60b. Under the present circumstance, when the sum total of the leakage current is larger than the on-state current supplied from a transconductance amplifier stage in an enabled state, even if the on-state current which flows through the output signal line 43 is increased by changing the gain, the total signal current does not increase so much because the leakage current also flows through the output signal line correspondingly, resulting in a poor gain accuracy. In order to solve the problem, the leakage current is reduced using the N-channel MOS transistor NQ5 for equalization.

Figure 7:
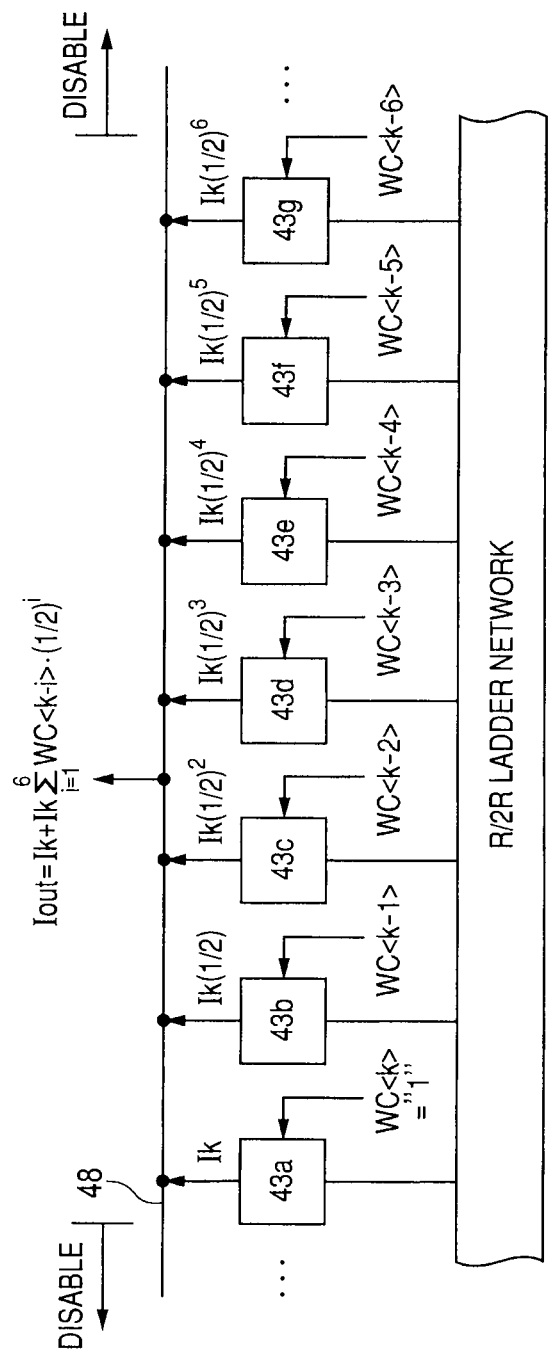
FIG. 7 is a drawing illustrating relationship of an output current of a variable gain driver and a control word, according to Embodiment 1 of the present invention.

FIG. 7 illustrates schematically an operation mode of the variable gain driver according to Embodiment 1 of the present invention. In FIG. 7, seven stages of transconductance amplifier stages 43a-43g are used. The remaining transconductance amplifier stages are maintained in a disabled state (not-selected state). Control word bits WC<k>, WC<k−1>, . . . , WC<k−6> are supplied to the transconductance amplifier stages 43a-43g, respectively. When enabled, the transconductance amplifier stages 43a-43g supply to the output signal line 48 weighted current Ik, Ik·(½), Ik·(½)^2, (½)^6, respectively. Accordingly, since the highest control word bit WC<k> is set to "1", the output current Iout which appears in the output signal line 48 is expressed by the following equation:

$$Iout = lk + lk \cdot \sum_{i=1}^{6} WC<k-i> \cdot \left(\frac{1}{2}\right)^i \quad \text{(Equation 1)}$$

As clearly seen from the above equation, by adjusting the bit value of the control word bits WC<k>-WC<k−1>, it is possible to adjust the amplitude of the output current Iout in 0.125 dB steps. In the present case, in the voltage/current conversion unit 42, seven transconductance amplifier stages 43a-43g are selectively set in an enabled state and consume current, and the remaining transconductance amplifier stages are in a disabled state and do not supply any current to the output signal line 48 (only negligible leakage current flows). Accordingly, it is possible to reduce the consumption current, compared with the configuration in which all the transconductance amplifier stages are set in an enabled state and consume current.

As described above, according to Embodiment 1 of the present invention, with the use of the resistor ladder network, an input voltage is subdivided sequentially and transmitted, and each subdivided voltage is converted into current using the transconductance amplifier stage of the same configuration, and the current is transmitted to the common output signal line. Accordingly, it is possible to adjust the output gain in arbitrary steps, and it is also possible to make the dynamic range broad by increasing the number of stages of the resistor ladder network and the transconductance amplifier stages.

It is possible to realize signal amplification of a fine resolution step and a high dynamic range, by adjusting the gain only by one stage of the variable gain driver, accordingly, no additional amplifier is required. Therefore, the number of amplifier stages is reduced, and noise-induced degradation can be mitigated, compared with the configuration in which plural stages of amplifiers are cascade-coupled and the gain of each stage is adjusted. Further, it is possible to reduce the consumption current of the variable gain driver which consumes large current in a transmission system; therefore, it is possible to reduce the power consumption of the transmission system.

Embodiment 2

Figure 8:
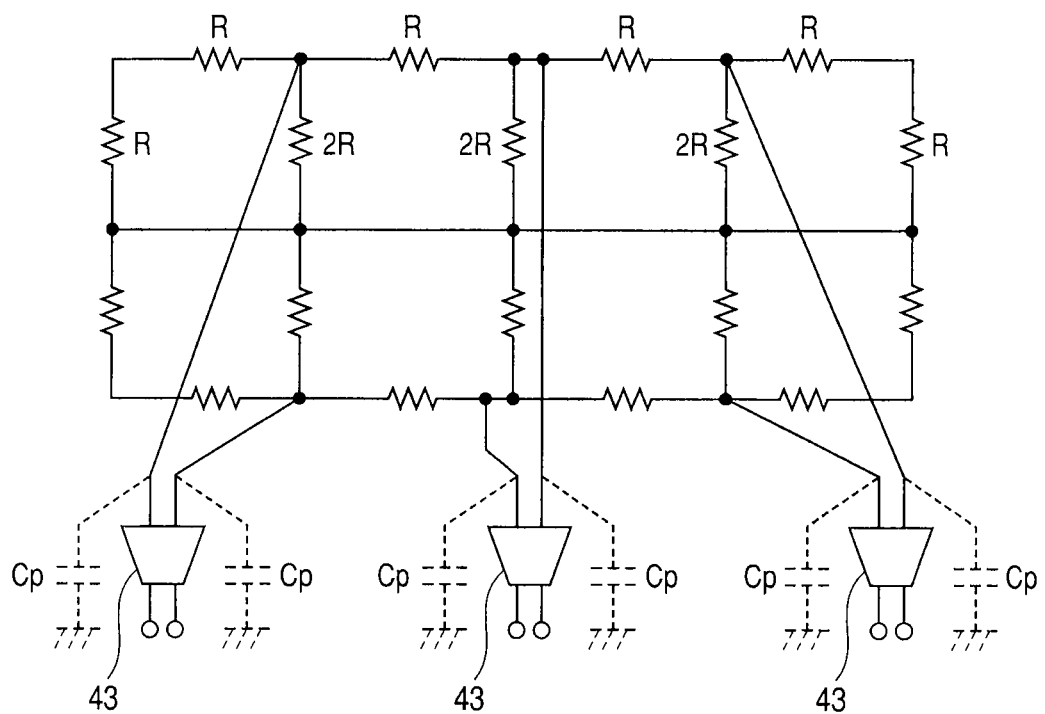
FIG. 8 is a drawing illustrating schematically a parasitic component of each node of the R-2R ladder network.

FIG. 8 illustrates a model of a delay circuit of the transconductance amplifier stage 43 and the R-2R ladder network. In FIG. 8, the configuration of three transconductance amplifier stages 43 and an R-2R ladder network which has the corresponding nodes is illustrated as an example. In the configuration illustrated in FIG. 8, a resistor R and a parasitic capacitance Cp are coupled to each of both inputs of the transconductance amplifier stage 43. Therefore, when voltage of the input signal is sequentially transmitted via a resistance element R of the R-2R ladder network, propagation delay of a signal occurs. When such propagation delay of the input signal occurs, phase fluctuation of a signal may occur in switching the transconductance amplifier stages.

Figure 9:
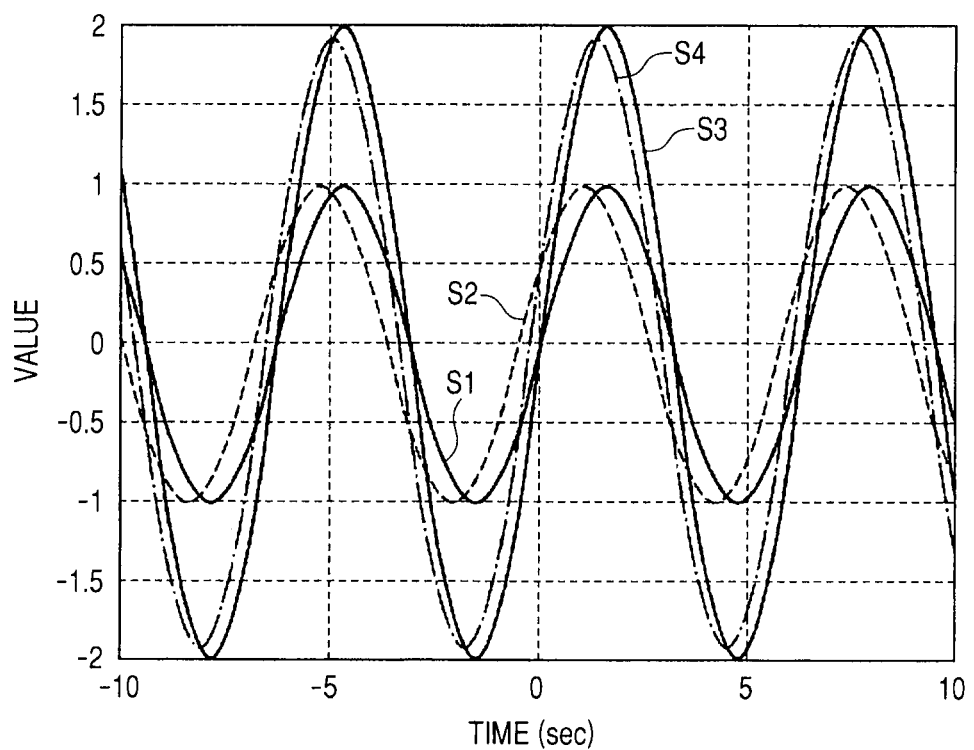
FIG. 9 is a drawing illustrating phase distortion of a propagation signal in the ladder network illustrated in FIG. 8.

FIG. 9 illustrates waveforms of the result that the source signal and the delayed signal are combined (added) in the delay model illustrated in FIG. 8. The voltage gain in the delay circuit is set to one. In FIG. 9, the horizontal axis indicates time, and the vertical axis indicates the amplitude of a correction signal (in arbitrary unit).

Curve S1 is a source signal and is expressed by $\sin(\omega t)$. Curve S2 is a delayed signal of the source signal, and is expressed by $\sin(\omega t+\theta)$.

Curve S3 is the waveform of the combined signal of sine waves in case there is no phase fluctuation (no delay), and is expressed by $2\cdot\sin(\omega t)$. Curve S4 is the combined signal waveform when a phase fluctuation occurs, and is expressed by $\sin(\omega t)+\sin(\omega t+\theta)$.

When no delay exists in the delay model illustrated in FIG. 8, the source signal is added and $\sin(\omega t)$ indicated by Curve S1 is superimposed. In the case, the combined waveform is given by $\sin(\omega t)+\sin(\omega t)=2\cdot\sin(\omega t)$, and the signal waveform indicated by Curve S3 is obtained.

On the other hand, when the phase fluctuation has occurred, combination (addition) of the waveforms indicated by Curve S1 and Curve S2, or $\sin(\omega t)$ and $\sin(\omega t+\theta)$, yields the signal waveform expressed by the following equation: $\sin(\omega t)+\sin(\omega t+\theta)=2\cdot\sin(2\cdot\omega t+\theta)\cdot\cos(\theta/2)$.

The combined signal waveform is expressed by Curve S4, and the amplitude thereof is smaller than the case where no delay exists, therefore the voltage gain becomes smaller.

Namely, as illustrated in FIG. 8, when the R-2R ladder resistor network is used, the configuration has N stages of the RC delay stage formed by the resistor R and the capacitance Cp. Due to the delay circuit with a time constant R·Cp, a phase fluctuation is caused to appear. By eliminating the present phase fluctuation factor, a more accurate voltage gain adjustment can be realized.

Figure 10:
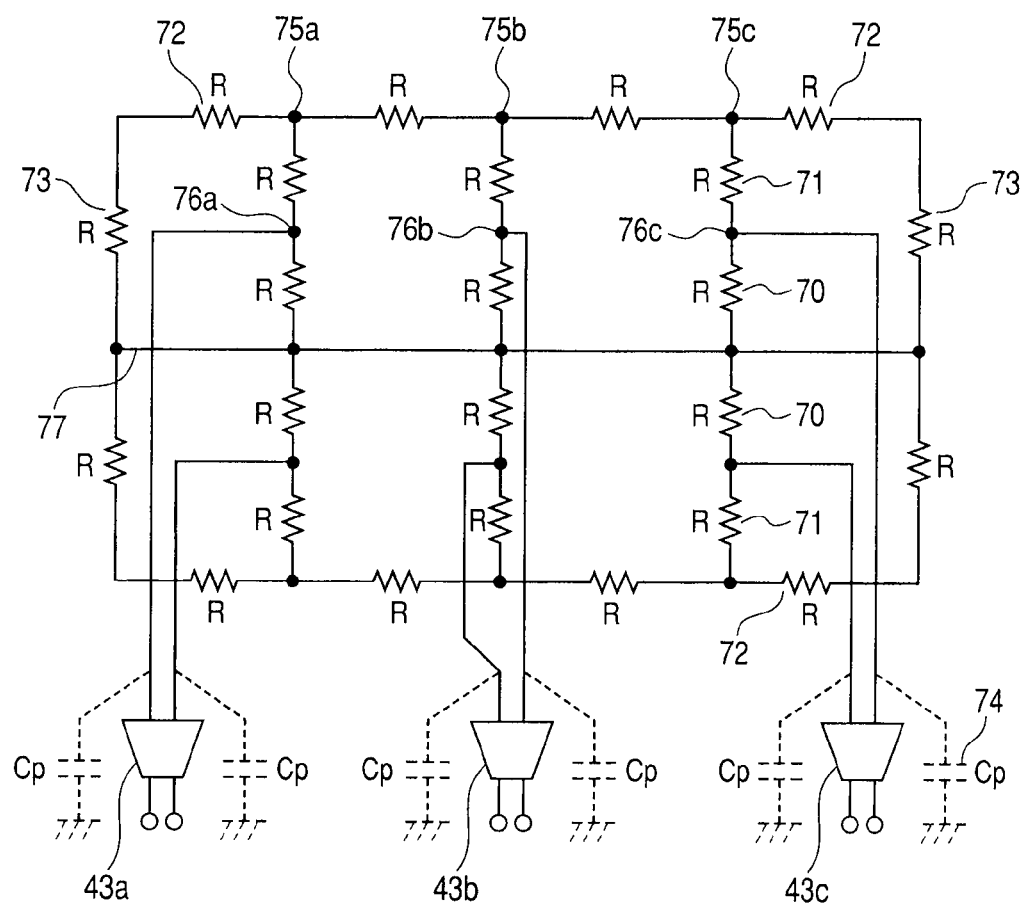
FIG. 10 is a drawing illustrating schematically a configuration of a principal part of a variable gain driver according to Embodiment 2 of the present invention.

FIG. 10 illustrates a simplified configuration of a variable gain driver according to Embodiment 2 of the present invention. FIG. 10 illustrates an example of a configuration of transconductance amplifier stages 43a-43c and a four-stage R-2R ladder networks. As illustrated in FIG. 10, as for the transconductance amplifier stages 43a-43c, a shunt resistance element of a value of resistance 2R is divided into two sub resistance elements 71 and 70, each having a value of resistance R and coupled in series. Connection nodes 76a-76c between the sub resistance elements 71 and 70 are coupled to input nodes of the corresponding transconductance amplifier stages 43a-43c, respectively. Coupling to a positive input and a negative input of the transconductance amplifier 43a-43c is made in the similar manner.

In the present coupling manner, in each of the transconductance amplifier stages 43a-43c, the sub resistance element 71 and the parallel body of a shunt resistance (sub resistance element) 70 and a capacitive element Cp 74 are coupled in series to the input node. Therefore, a value of resistance of each input node of the transconductance amplifier stages 43a-43c is 3R/4. However, at connection nodes 75a-75c of a resistance element 72, a value of resistance coupled to the nodes 75b and 75c in the direction of each right-hand side is R, accordingly, a voltage of one half of the voltage at a node on each left-hand side is transmitted to the nodes 75b and 75c.

When an input current is assumed to be Iin, a voltage at the node 75a is Vin=Iin·2·R/3, as is the case with Embodiment 1. Therefore, to the input nodes 76a-76c of the transconductance amplifier stages 43a-43c, a voltage of one half of the voltage at the nodes 75a-75c is transmitted, respectively. Accordingly, a voltage of one half (½) and a voltage of one fourth (¼) of the voltage at the input node 76a appear at the nodes 76b and 76c, respectively. Therefore, the voltage amplitude changes in 6 dB steps, in the same manner as in Embodiment 1.

In the present coupling manner, the capacity 74 is separated from the nodes 75a-75c by the sub resistance element 71. Therefore, it is possible to reduce the influence of the capacitive element 74 on a signal transmitted via the series resistance 72, and it is possible to make the phase fluctuation θ smaller.

The present coupling manner is the same for the upper-side resistor network and the lower-side resistor network with respect to the AC grounding conductor 77. Therefore, the influence of the parasitic capacitance Cp at both inputs of the transconductance amplifier stages 43a-43c can be suppressed, and the voltage gain can be brought nearly close to the theoretical value (ideal value) by a phase fluctuation control. Accordingly, it is possible to realize the variable gain driver excellent in the linearity of the power control.

Figure 11:
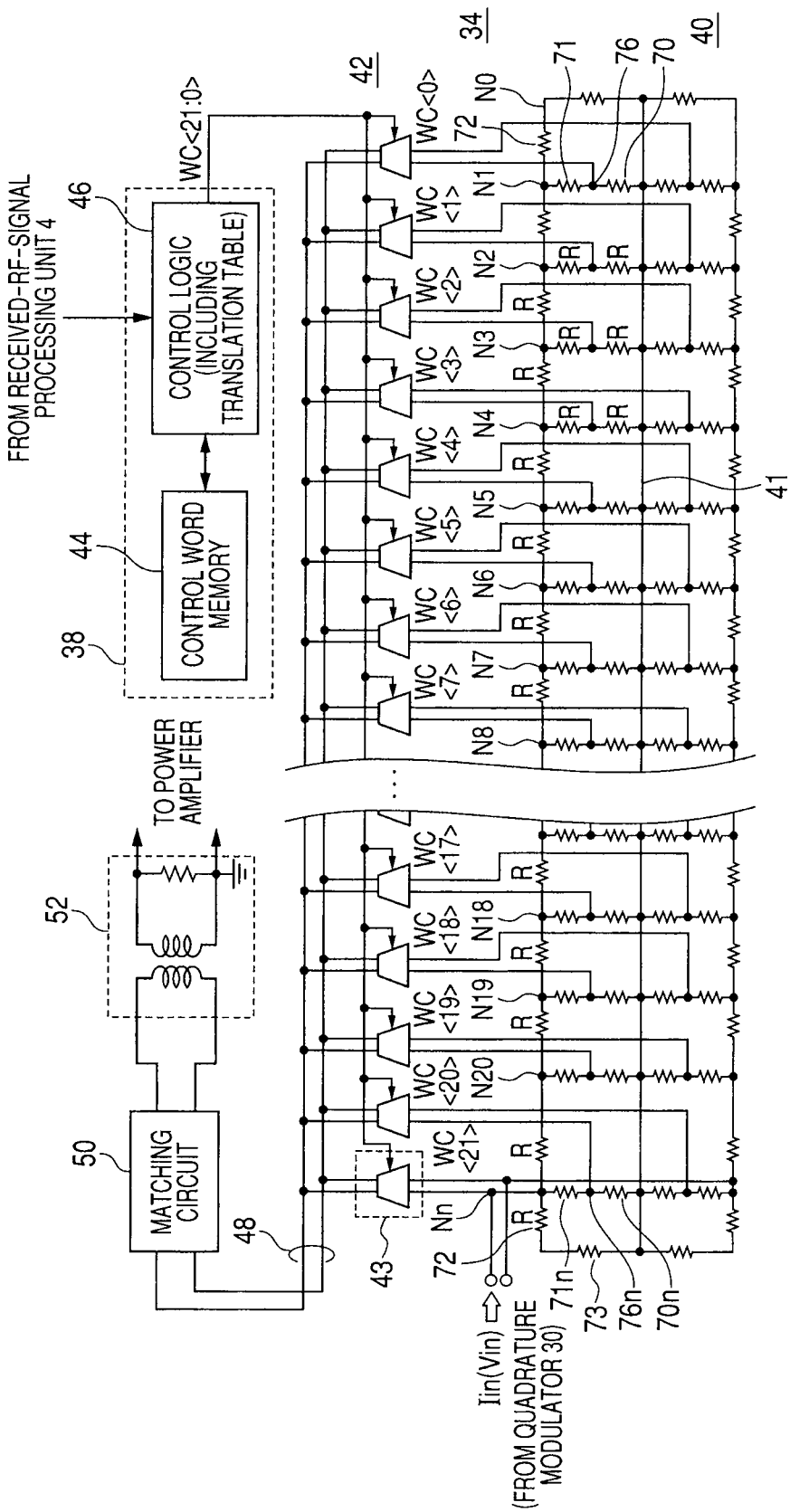
FIG. 11 is a drawing illustrating schematically a configuration of the variable gain driver according to Embodiment 2 of the present invention.

FIG. 11 illustrates schematically a configuration of the variable gain driver 34 according to Embodiment 2 of the present invention. The variable gain driver illustrated in FIG. 11 is different in configuration from the variable gain driver illustrated in FIG. 4 according to Embodiment 1 in the following points. That is, in the R-2R ladder network 40, a shunt resistance between an internal voltage dividing node and the AC grounding conductor 41 is divided into sub resistance elements 70 and 71 having a value of resistance R. In the tansconductance amplifier stage 43 except for the highest transconductance amplifier stage, each input node is coupled to a connection node 76 corresponding to internal nodes N1-N20 and an input node Nn, which are located in the one-bit upper direction compared with the configuration illustrated in FIG. 4. For example, a transconductance amplifier stage 43 which receives the second highest control word bit WC<20> is coupled to the connection node 76n of a sub resistance elements 71n and 72n which are provided to the input node Nn. A transconductance amplifier stage 43 on the right-hand side (one-bit lower side) is coupled to a connection node 76n between sub shunt resistance elements 71n and 70n which are coupled to the input node Nn. A transconductance amplifier stage 43 which receives a control word bit WCV<i> is coupled to a connection node 76 between sub resistance elements 71 and 72 corresponding to an internal node N(i+1). No transconductance amplifier stage is coupled to an internal voltage dividing node N0 located on the rightmost side of FIG. 11.

The other components of the configuration illustrated in FIG. 11 are the same as that of the configuration illustrated in FIG. 4, therefore, the same reference symbol is attached to the corresponding component, and the detailed explanation thereof is omitted.

The highest transconductance amplifier stage 43 that receives a control word bit WC<21> is coupled to the input node Nn. That is, the voltages of the internal nodes N1-N20 and the input node Nn are subdivided to one half, respectively, by the resistive subdivision of the sub resistance elements 70 and 71. The transconductance amplifier stage 43 of the highest-order bit is coupled to the input node Nn. Therefore, as is the case with Embodiment 1, each of the transconductance amplifier stages 43 which receive the control word bits WC<21>-WC<0> receives a voltage of one half of the input voltage of a transconductance amplifier which receives a control word bit of one-bit high order. Therefore, as is the case with Embodiment 1, voltage amplitude of the input voltage of the transconductance amplifier stage 43 is respectively reduced by one half. Accordingly, it is possible to realize the same gain control as in the coupling in the R-2R ladder network of Embodiment 1 illustrated in FIG. 4.

The control mode of the control word WC<21:0> to the variable gain driver illustrated in FIG. 11 is the same as the adjustment of the control word bit of the variable gain driver in Embodiment 1 (refer to FIG. 4).

As described above, according to Embodiment 2 of the present invention, in the R-2R ladder network, the shunt resistance element 2R coupled between the voltage propagation node and the AC grounding conductor is divided into two, and, except for the input node, the connection node between the sub resistance elements divided into two is coupled to the input node of the transconductance amplifier arranged corresponding to the one-bit lower node. Accordingly, the parasitic capacitance accompanying the input node of the transconductance amplifier and the voltage propagation node (voltage dividing node) of the ladder network can be isolated. Correspondingly, it is possible to suppress a phase fluctuation in switching the transconductance amplifier stages, due to a signal propagation delay in the resistor ladder network, accordingly, it is possible to perform the accurate voltage gain control. Furthermore, the same effects as in Embodiment 1 can be obtained.

Embodiment 3

Figure 12:
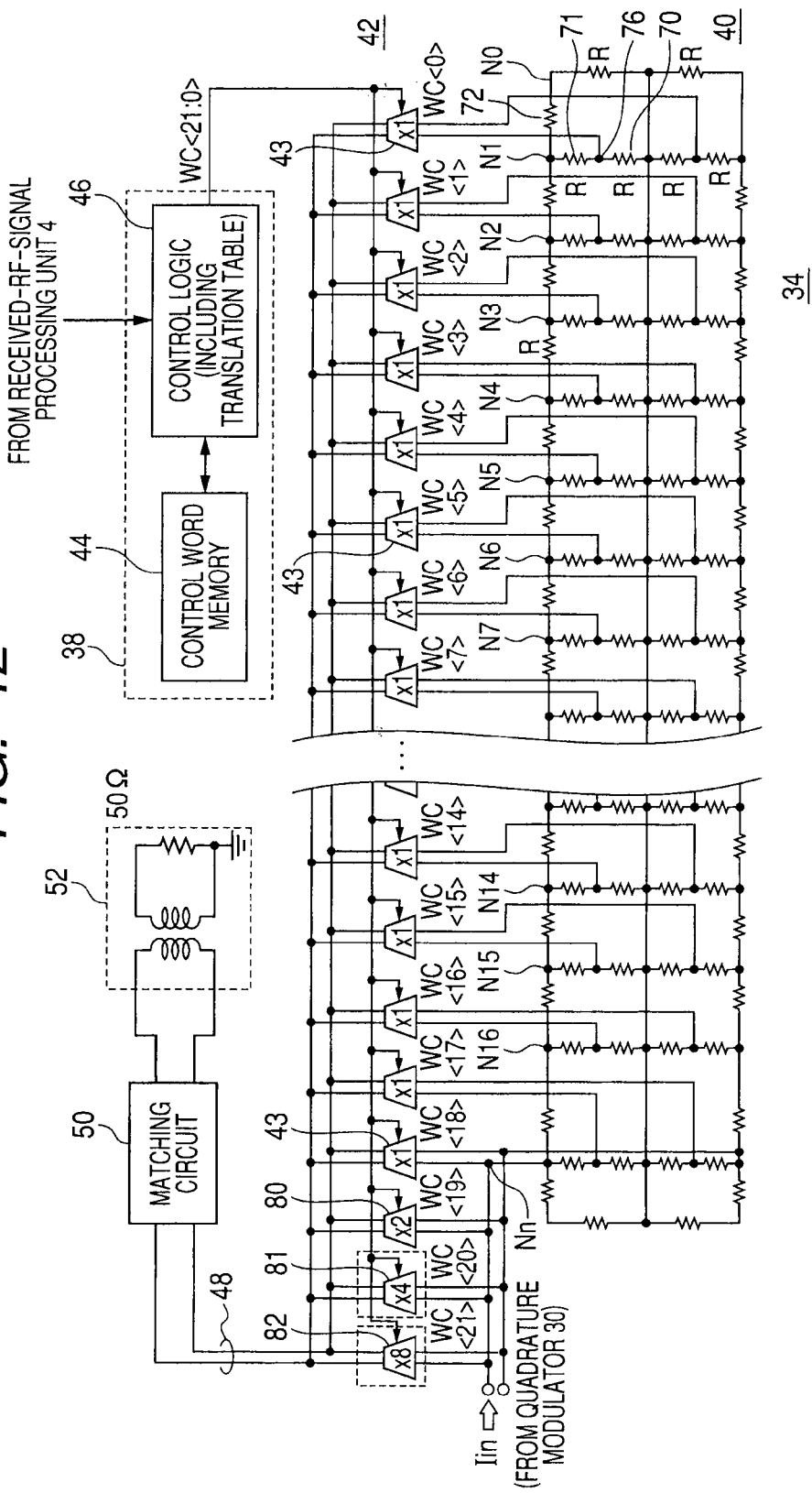
FIG. 12 is a drawing illustrating schematically a configuration of a variable gain driver according to Embodiment 3 of the present invention.

FIG. 12 illustrates schematically a configuration of a variable gain driver according to Embodiment 3 of the present invention. In FIG. 12, the variable gain driver 34 is different in configuration from the variable gain driver illustrated in FIG. 11 in the following points. That is, transconductance amplifiers 80, 81, and 82 of which the transconductance gm is enlarged every two times are provided in parallel with the input node Nn. The transconductance amplifier 80 has two times greater current supply capability than that of the transconductance amplifier stage 43, and is formed equivalently by two transconductance amplifier stages 43 coupled in parallel. The transconductance amplifier 81 has four times greater current supply capability than that of the transconductance amplifier stage 43, and is formed equivalently by four transconductance amplifier stages 43 coupled in parallel. The transconductance amplifier 82 has eight times greater current supply capability than that of the transconductance amplifier stage 43, and is formed equivalently by eight transconductance amplifier stages 43 coupled in parallel. The transconductance amplifiers 80, 81, and 82 receive control word bits WC<19>, WC<20>, and WC<21>, respectively.

In the present configuration, the transconductance amplifiers 80, 81, and 82 receive the input signal Vin (input current Iin) in common, and the respective output current is two times, four times, and eight times greater than that of the transconductance amplifier stage 43 coupled to the input node Nn. Therefore, it is possible to produce the current change of gain in units of 6 dB by the transconductance amplifiers 80, 81, and 82.

The other configuration of the variable gain driver 34 illustrated in FIG. 12 is the same as that of the variable gain driver 34 illustrated in FIG. 11, therefore, the same reference number is attached to the corresponding component, and the detailed explanation thereof is omitted.

In the configuration of the variable gain driver 34 illustrated in FIG. 12, the transconductance amplifiers 80, 81, and 82 of which the respective transconductance gm is enlarged by weighting of two are coupled in parallel to the input node Nn. Therefore, the gain control range is from 0 dB to 96 dB, as is the case with Embodiment 1 and Embodiment 2. When the gain of the output current of the transconductance amplifier stage 43 which receives the control word bit WC<6> is 0 dB, the number of series-coupled resistance elements 72 in the R-2R ladder network 40 is reduced by three stages. The amplitude of voltage supplied to the transconductance amplifier stages 43 coupled to the internal nodes (voltage dividing nodes) N1 through N16, respectively becomes eight times larger (the third power of two), compared with the configuration of the variable gain driver illustrated in FIG. 11 (this is because the present configuration is equivalent to the configuration which is shifted to the upper bit direction (left-hand side) by three stages of resistors). Therefore, the transconductance gm of the transconductance amplifier stage 43 can be made small compared with the configuration illustrated in FIG. 11, and correspondingly, the occupied area can be reduced. Consumption current at the time of a low power output can be also reduced, as will be explained in the following.

Figure 13:
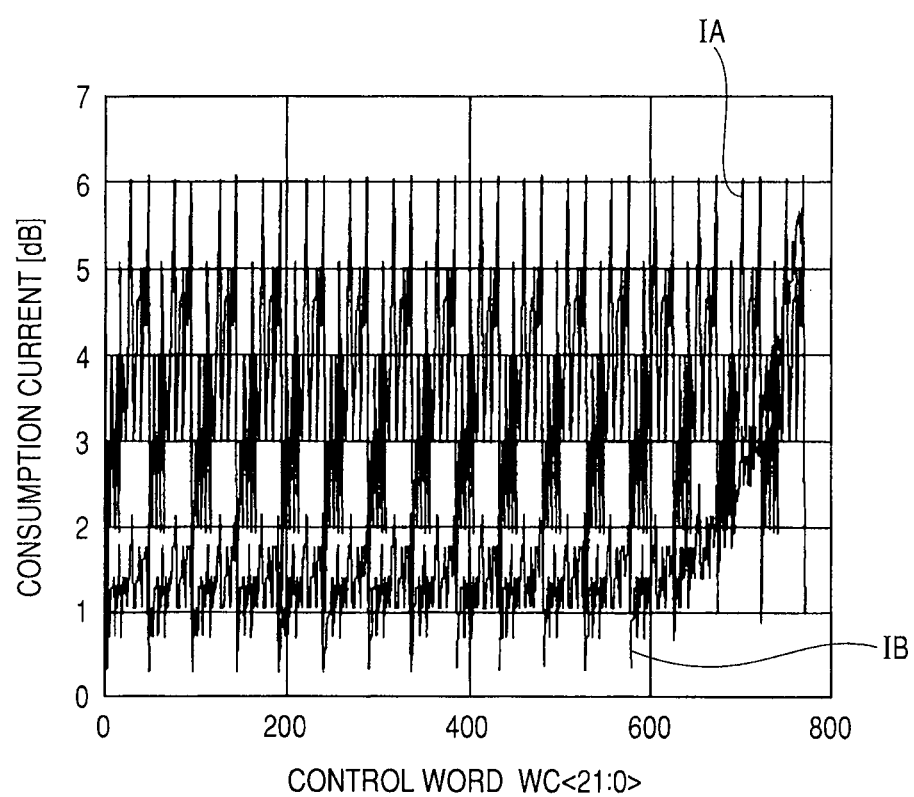
FIG. 13 is a drawing illustrating the amount of consumption current of the variable gain driver illustrated in FIG. 12 and the variable gain driver according to Embodiment 1.

FIG. 13 illustrates the consumption current of both the variable gain driver 34 illustrated in FIG. 12 and the variable gain driver illustrated in FIG. 11. In FIG. 13, the horizontal axis indicates the control word WC<21:0> in decimal digits, and the vertical axis indicates the consumption current in dB.

Curve IA indicates the consumption current of the variable gain driver illustrated in FIG. 11, and Curve IB indicates the consumption current of the variable gain driver illustrated in FIG. 12 according to Embodiment 3.

As illustrated by Curve IA, in the case of the configuration of the variable gain driver illustrated in FIG. 11, according to the control word WC<21:0>, the consumption current increases and decreases corresponding to a value of the control word, in a period of 6 dB expressed by seven bits of the control word. The increase and decrease in the amount of consumption current in Curve IA is produced corresponding to the change of the number of transconductance amplifier stages which are rendered in an enabled state at the same time. In the configuration illustrated in FIG. 11, the amount of consumption current changes largely from 1 dB to 6 dB over the total range of the control word WC<21:0>.

On the other hand, as illustrated by Curve IB, in the configuration of the variable gain driver illustrated in FIG. 12, at the time of a low power output, the amount of consumption current changes between 1 dB and 2 dB with a period of 6 dB expressed by the control word WC<21:0>. At the time of a high-gain output, the transconductance amplifiers 80-82 coupled to the input node consume current. Therefore, the consumption current increases and finally becomes comparable with the consumption current of the variable gain driver illustrated in FIG. 11.

In the configuration illustrated in FIG. 12, input voltage amplitude transmitted to each transconductance amplifier stage 43 via the resistor ladder network becomes smaller, compared with the configuration of the variable gain driver illustrated in FIG. 11. Since the input voltage amplitude is small, the current supplied to the output signal line can be correspondingly made small in the case of the same gain. Correspondingly, the consumption current at the time of a low power output can be reduced compared with the configuration illustrated in FIG. 11, as explained minutely in the following.

Figure 14:
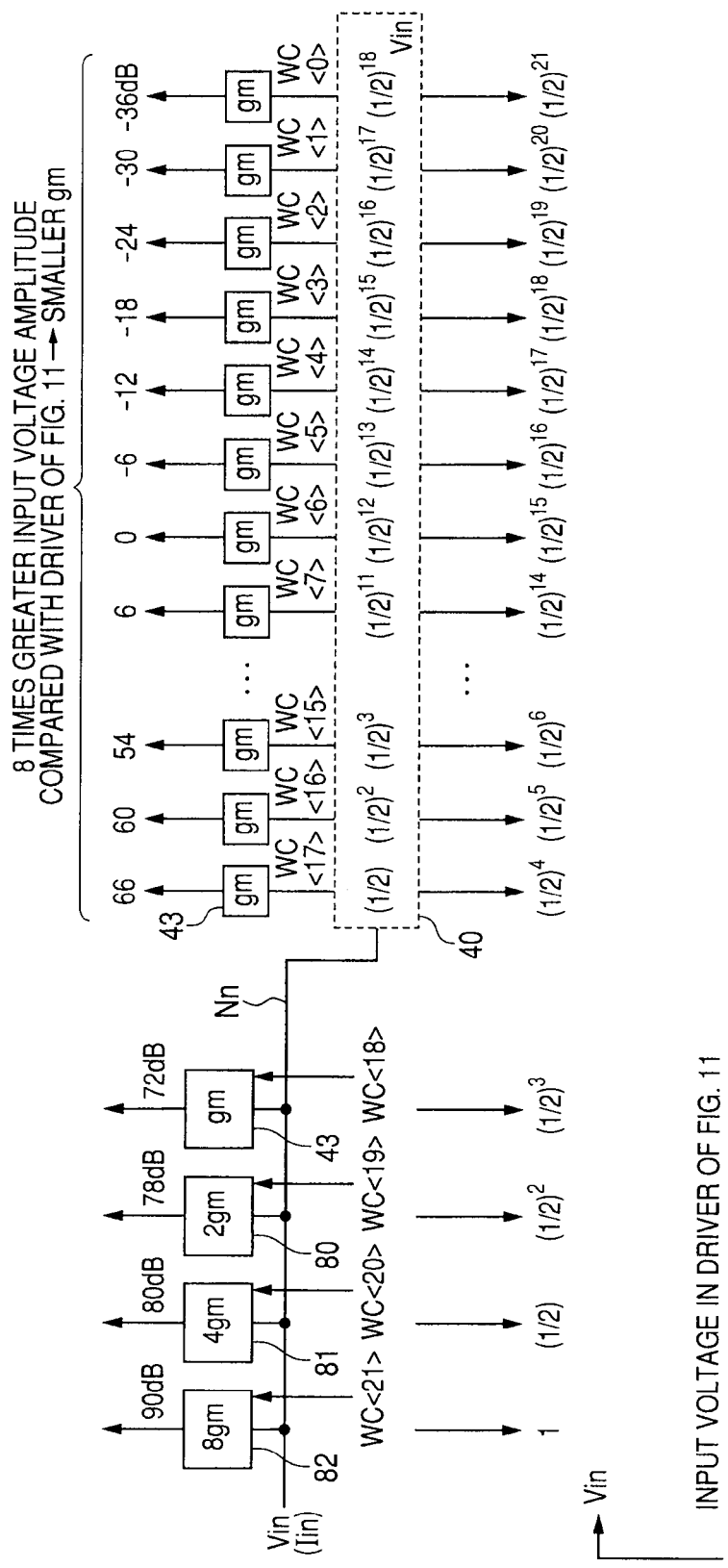
FIG. 14 is a drawing illustrating schematically correspondence of the consumption current and the output gain of the variable gain driver according to Embodiment 3 of the present invention.

FIG. 14 illustrates schematically input voltage amplitude to each transconductance amplifier in the variable gain driver according to Embodiment 3 of the present invention. As illustrated in FIG. 14, the control word bits WC<18>-WC<21> are supplied to the transconductance amplifier stage 43n and the transconductance amplifiers 80-82 which are coupled to the input node Nn, respectively. In the R-2R ladder network 40, the transconductance amplifier stages 43 are coupled similarly. An input voltage Vin is supplied in common to the transconductance amplifier stage 43n and the transconductance amplifiers 80, 81, and 82 which are coupled to the input node Nn. On the other hand, to the transconductance amplifier stages 43 to which enabling/disabling is controlled by the control word bits WC<0>-WC<17>, the input voltage amplitude is sequentially reduced every one half. The gain control range is 0 dB to 96 dB as is the case with the configuration illustrated in FIG. 11, and the gain from −36 db to 90 dB which changes in 6 dB steps is allocated to each amplifier stage.

On the other hand, in contrast to each amplifier stage illustrated in FIG. 14, in the configuration of the variable gain driver illustrated in FIG. 11, the transconductance amplifier stages 43 receive the control word bits WC<21> through WC<0> and the input voltage of which the amplitude is sequentially reduced every one half.

As illustrated in FIG. 14, when the same gain control as the gain control which is performed by the control word WC<21:0> for the variable gain driver illustrated in FIG. 11 is performed, the transconductance gm of the transconductance amplifier stages 43 which have (basic) transconductance gm can be made small. Namely, as illustrated in FIG. 14, as for the transconductance amplifier stages 43 each of which receives a subdivided voltage at the internal node of the R-2R ladder network 40, the transconductance can be set to one eighth (⅛) in magnitude compared with the transconductance of the configuration illustrated in FIG. 11. Therefore, at the time of a low power output, the input voltage amplitude of a transconductance amplifier stage which is controlled by a control word of a lower-order bit becomes large, correspondingly, the amount of driving current can be reduced compared with the configuration illustrated in FIG. 11, and the consumption current can be reduced. The number of series resistance elements and shunt resistances in the R-2R ladder network 40 is also reduced; correspondingly, the current consumed by the resistance elements in the ladder network 40 can be reduced.

(Modified Example)

Figure 15:
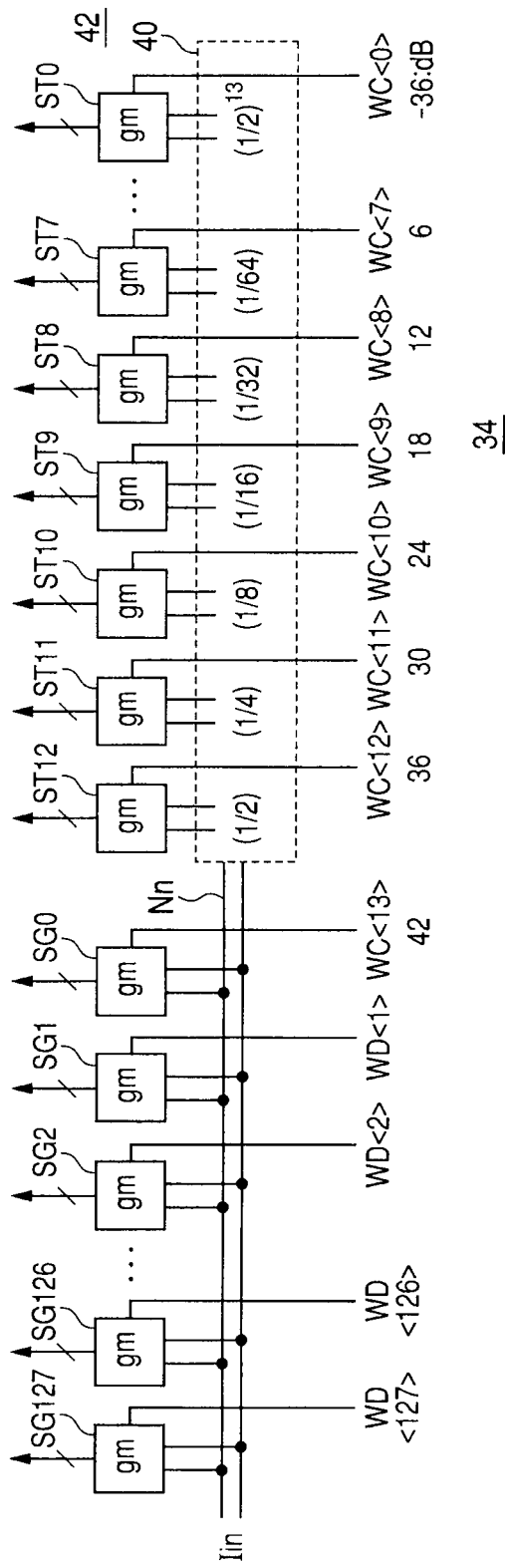
FIG. 15 is a drawing illustrating schematically a configuration of a variable gain driver in a modified example according to Embodiment 3 of the present invention.

FIG. 15 illustrates schematically a configuration of a variable gain driver 34 in a modified example of Embodiment 3 of the present invention. In FIG. 15, the variable gain driver 34 includes transconductance amplifier stages ST0-ST12 provided corresponding to each node of an R-2R ladder network 40, and transconductance amplifier stages SG0-SG127 coupled in parallel with an input node Nn. The transconductance stage amplifiers ST0-ST12 and the transconductance stage amplifiers SG0-SG127 have the same basic transconductance gm.

To the transconductance amplifier stages ST0-ST12 provided to the R-2R ladder network 40, control word bits WC<0>-WC<12> are supplied, respectively.

A control word bit WC<13> is supplied to the transconductance stage SG0, and control word bits WD<1>-WD<127> are supplied to the transconductance stages SG1-SG127. The control word bits WD<1>-WD<127> and WC<13> are expressed by a thermometer code. The transconductance amplifier stages SG0-SG127 are switched to an enabled state one by one sequentially, and the number of transconductance amplifiers in an enabled state increases monotonically.

The transconductance amplifier stage SG0 corresponds to an amplifier to which the gain of 42 dB is allocated. Therefore, in the R-2R ladder network 40, the voltage of amplitude of one half (½) to the thirteenth power of one half ((½)^13) of the voltage of the input signal voltage Vin (input current Iin) is generated, respectively.

The control mode by the control word WC<13:0> of the present transconductance amplifier stages ST0-ST12 and SG0 is the same as in Embodiment 1. As illustrated in FIG. 15, the number of transconductance amplifier stages ST0-ST12 provided corresponding to the voltage dividing nodes of the R-2R ladder network 40 is reduced, and the amplitude of voltage supplied to the present transconductance amplifier stages ST0-ST12 is enlarged to the eighth power of two (2^8), in comparison with the configuration according to Embodiment 1. Therefore, it is possible to make basic transconductance gm smaller, accordingly, it is possible to reduce the consumption current at the time of a low power output as is the case with the configuration illustrated in FIG. 14.

The configuration of the control logic and the control circuit of the output unit and the output signal line of the other control word memories of the variable gain driver 34 illustrated in FIG. 15 is the same as that of the variable gain driver illustrated in FIG. 11. Hereafter, with reference to FIG. 16 through FIG. 18, the gain control mode of the variable gain driver 34 illustrated in FIG. 15 is explained.

Figure 16:
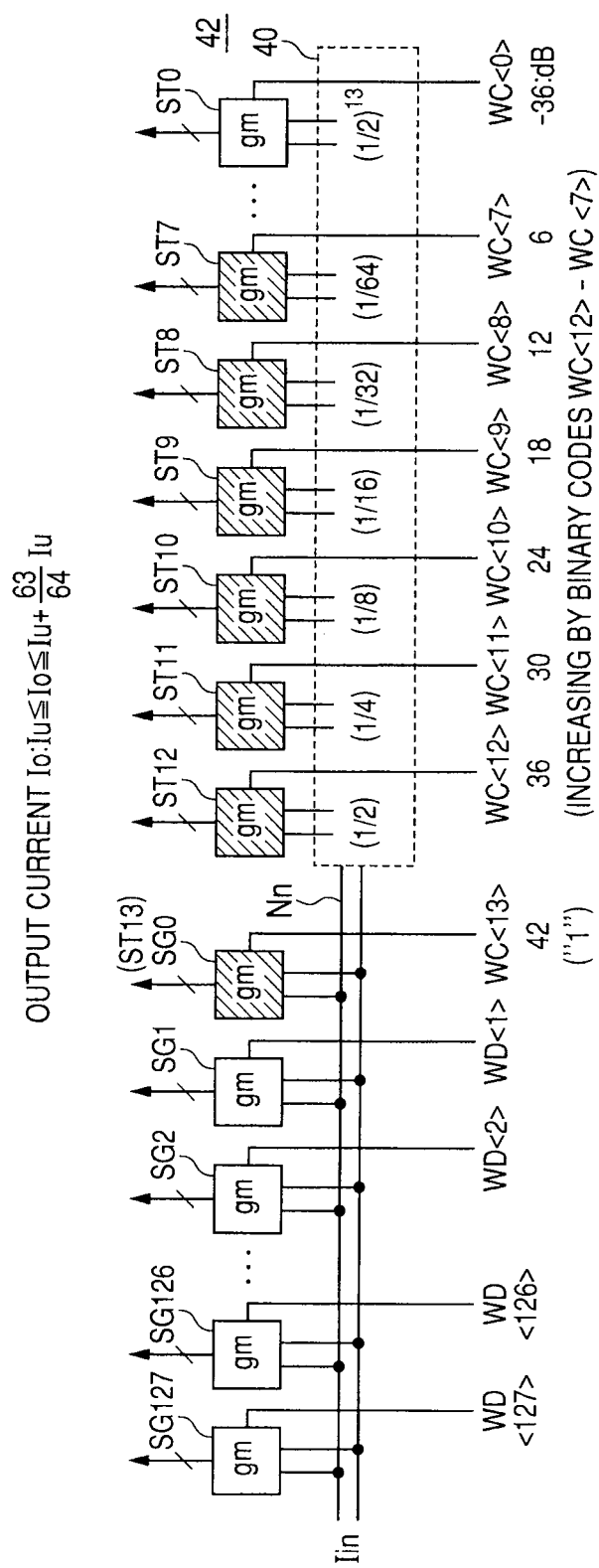
FIG. 16 is a drawing illustrating schematically a gain control mode of the variable gain driver illustrated in FIG. 15.
Figure 17:
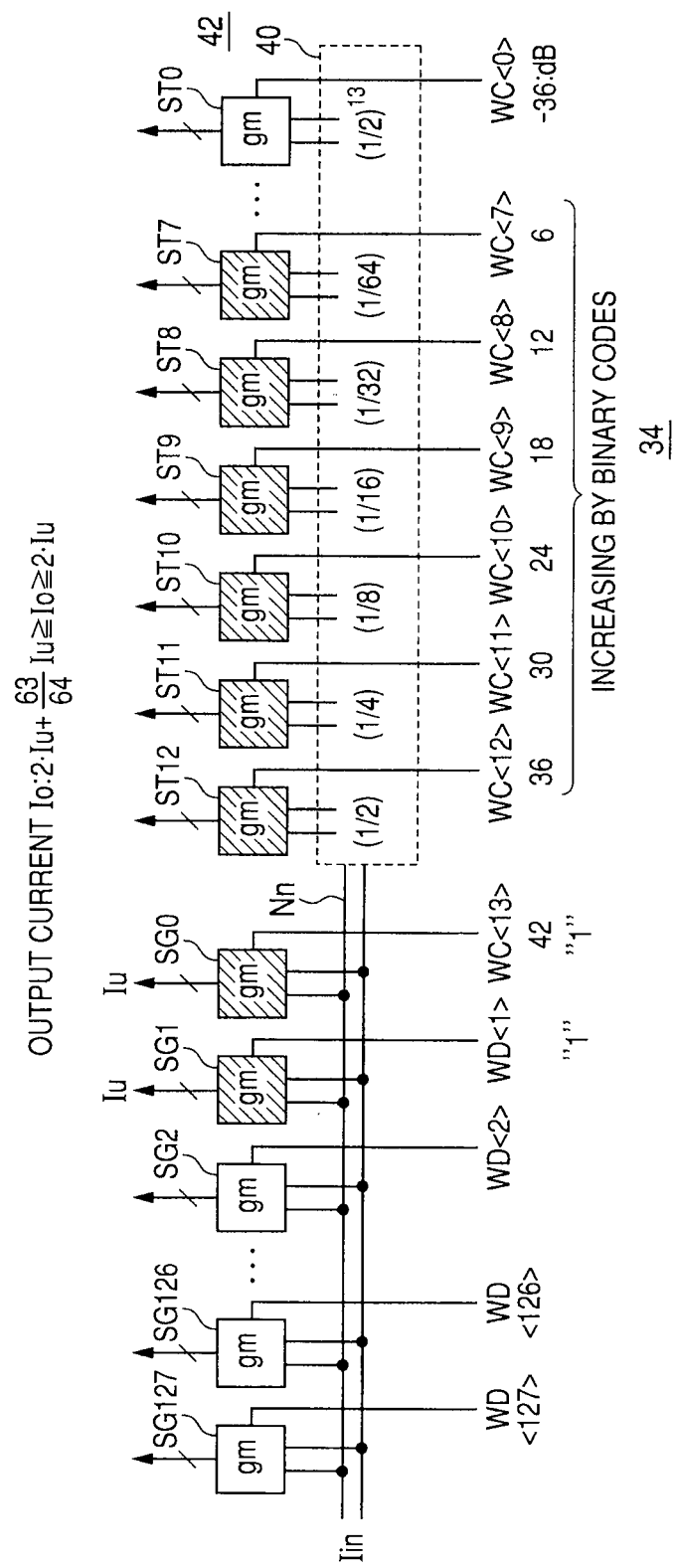
FIG. 17 is a drawing illustrating schematically a gain control mode of the variable gain driver illustrated in FIG. 15.

As illustrated in FIG. 16, in the R-2R ladder network 40, the control mode of control word bits WC<13>-WC<0> is the same as that of Embodiment 1. That is, the transconductance amplifier stages ST0-ST12 are selectively enabled in units of seven bits according to a binary code representation of the control word, and generate the output current. Now consider the state where the control of the output current supplied by the transconductance amplifier stages SG0 (=ST13) and ST12-ST7 is performed by the control word bits WC<13>-WC<7>. The highest control word bit WC<13> is set to "1", and the remaining control word bits WC<12>-WC<7> are updated corresponding to the binary representation (the conversion of the control word is performed in order to maintain the linearity of the gain control). In the present case, the output gain changes between 42 dB to 48 dB. When the driving current of the transconductance amplifier stage SG0 is expressed as Iu, the output current Io is given by the following expression: Iu=Io=Iu+63·Iu/64. When the gain control range is shifted from the state illustrated in FIG. 16 to the upper side by 6 dB, the control word bits WD<1> and WC<13> are set to "1" to enable both transconductance amplifier stages SG0 and SG1, as illustrated in FIG. 17. At this time, to the transconductance amplifier stages ST12-ST8, the control word bits WC<12>-WC<8> are sequentially incremented from the lower-order bit in the binary code representation. In the present case, the current in an output signal line (not shown) changes between 2·Iu and 2·Iu+63·Iu/64, in a minimum step of 0.125 dB.

Figure 18:
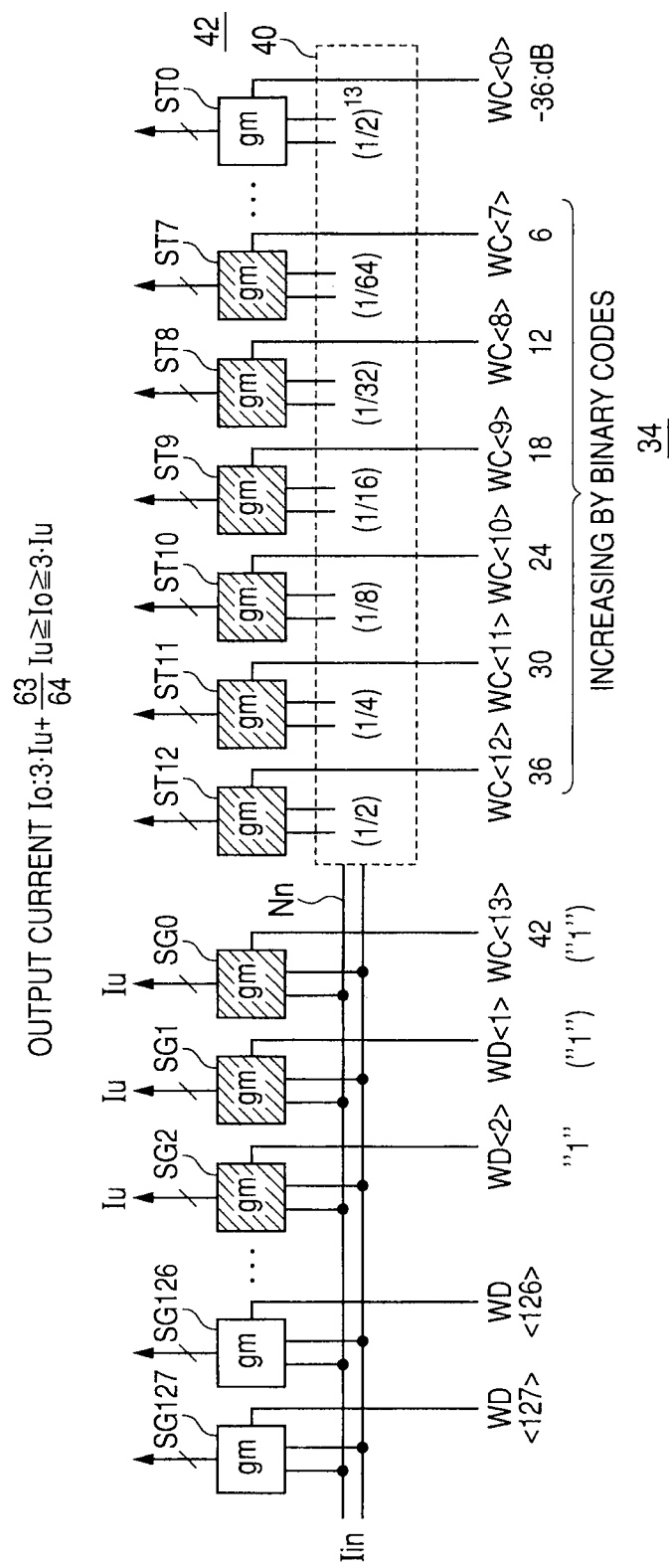
FIG. 18 is a drawing illustrating schematically a gain control mode of the variable gain driver illustrated in FIG. 15.

When both the transconductance amplifier stages SG0 and SG1 coupled to the input node Nn are set to an enabled state, the current value only changes from 2·Iu to about 3·Iu, and the gain increment does not reach 6 dB. Therefore, when the control word bits WC<12>-WC<7> reach the maximum, subsequently, as illustrated in FIG. 18, the control word bits WD<2>, WD<1>, and WC<13> are set to "1", to enable the transconductance amplifier stages SG0-SG2. The transconductance amplifier stages ST12-ST7 are again set to an enabled state selectively using the control word bits WC<12>-WC<7>. In the present case, the change range of the output current Io becomes between 3·Iu and 3·Iu+63·Iu/64. Therefore, as illustrated in FIG. 17 and FIG. 18, by changing from the state where the transconductance amplifiers SG0 and SG1 are enabled to the state where all the transconductance amplifiers SG0-SG2 are enabled, and by enabling selectively the transconductance amplifier stages ST12-ST7, sequentially corresponding to the binary code (according to the control word bits WC<12>-WC<7>), the output current value can be set up from two times to four times, and the gain range of 6 dB can be realized.

By incrementing sequentially the number of amplifier stages enabled among the transconductance amplifier stages SG3-SG127 whenever the control word bits WC<12>-WC<7> reach the maximum, the gain can be controlled in 0.125 dB steps in the same manner as in Embodiment 1 and Embodiment 2.

In the present case, in the R-2R ladder network 40, the number of resistor stages is small, and the consumption current in the R-2R ladder network 40 can be reduced. It is possible to make small the basic transconductance gm of each of the transconductance amplifiers ST0-ST12 and SG0-SG127, accordingly, it is possible to reduce the consumption current at the time of a low power output.

Figure 19:
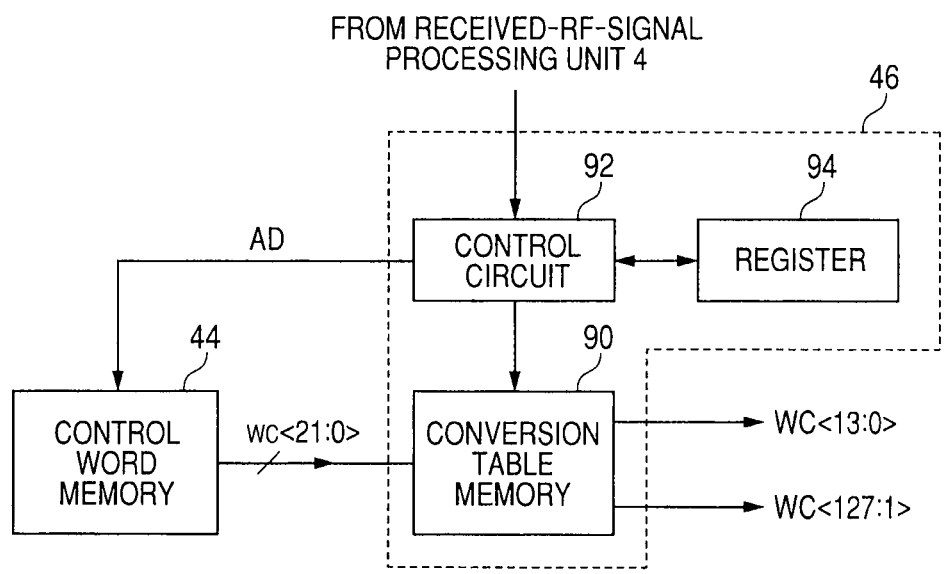
FIG. 19 is a drawing illustrating schematically a configuration of a logic memory according to Embodiment 3 of the present invention.

FIG. 19 illustrates schematically an example of a configuration of the gain control circuit 38 in the modified example according to Embodiment 3 of the present invention. In FIG. 19, the control logic 46 includes a conversion table memory 90 which converts the control word wc<21:0> read from a control word memory 44, a control circuit 92 which controls reading from the conversion table memory 90, and a register 94 which stores the present address of the control word memory 44.

The register 94 stores an address of the control word wc<21:0> read from the control word memory 44, or gain specified currently. The control circuit 92 calculates address AD to the control word memory 44 with reference to a value stored in the register 94 according to a gain control bit or a received signal level from the received-RF-signal processing unit 4. Using the present address AD, a control word corresponding to the specified gain is accessed. The control circuit 92 supplies the calculated address AD to the control word memory 44 with a read control signal, and reads the corresponding control word. The conversion table memory 90 converts a control word wc<21:0> read from the control word memory 44 under the control of the control circuit 90, and generates control words WC<13:0> and WD<127:1>. Using the conversion table memory 90, the control words WC<13:0> and WD<127:1> necessary for the gain control are generated at high speed.

The control word WD<127:1> maybe generated as follows. That is, a value of the control word bits WC<12>-WC<7> is monitored, and whenever the control word bits WC<12>-WC<7> reach the maximum, a flip-flop is set. On the other hand, a shift register, which has an input part coupled to the power node and 127 outputs, is arranged. When gain increment directions are supplied, a shift register makes one-bit shift operation in the upper direction according to the flip-flop in a set state. Accordingly, it is possible to generate the control word WD<127:1> in the thermometer code representation. When gain decrement directions is supplied, the flip-flop is reset and the shift operation of the shift register is stopped.

(Modified Example 2)

Figure 20:
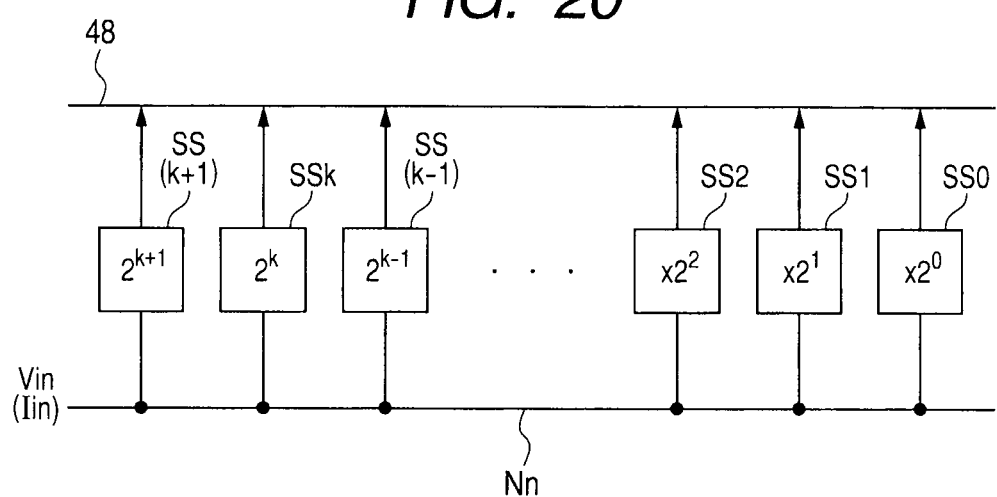
FIG. 20 is a drawing illustrating schematically a configuration of a variable gain driver as a premise of modified example 2 according to Embodiment 3 of the present invention.

FIG. 20 illustrates schematically a configuration of a variable gain driver to be considered in modified example 2 according to Embodiment 3 of the present invention. In the variable gain driver illustrated in FIG. 20, transconductance amplifier stages SS0-SS(k+1) are coupled in parallel to the input node Nn, and the output nodes of the amplifier stages SS0-SS(k+1) are coupled in common to the output signal line 48. The transconductance amplifier stages SS0-SS(k+1) are enlarged sequentially in transconductance every two times, and a transconductance amplifier stage SSi has the i-th power of two (2^i) times as high transconductance as the transconductance of the transconductance amplifier stage SS0.

It is now considered that, as illustrated in FIG. 20, the transconductance amplifier stages SS0-SS(k+1) are arranged in parallel with the input node Nn, and that the amount of current which appears in the output signal line 48 is adjusted by enabling selectively the transconductance amplifier stages SS0-SS(k+1) according to a control word. In the present configuration, the transconductance amplifier stage SSi has a configuration in which the i-th power of two (2^i) pieces of the transconductance amplifier stage SS0 are coupled in parallel. Therefore, for example, when a 22-bit control word is used as the control word, in the transconductance amplifier stage SS(k+1) corresponding to the highest-order bit, it is necessary that the twenty-first power of two (2^21) of the unit transconductance amplifier SS0 are arranged in parallel. As a result, the layout area increases greatly. When using the configuration illustrated in FIG. 20, the following problems arise.

Figure 21:
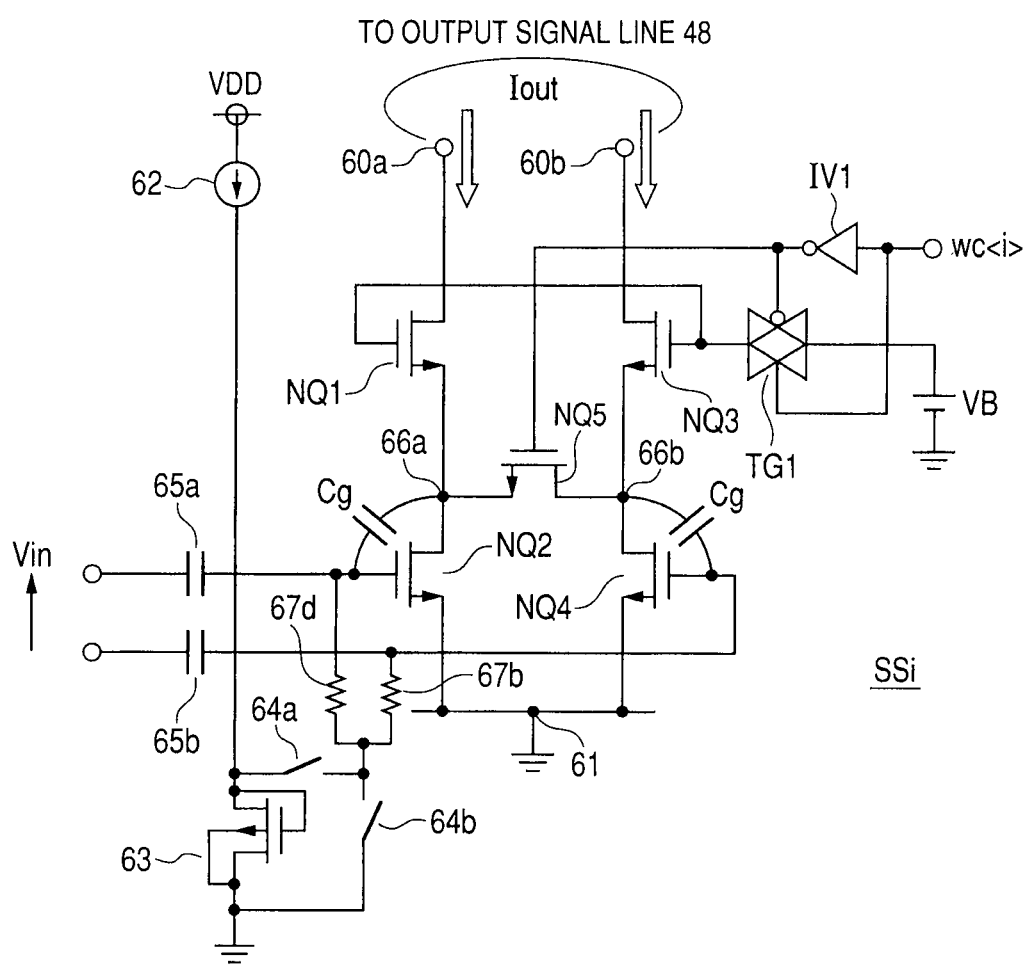
FIG. 21 is a drawing illustrating schematically a configuration of a transconductance amplifier stage of the variable gain driver illustrated in FIG. 20.

FIG. 21 illustrates an example of the configuration of the transconductance amplifier stage SSi illustrated in FIG. 20. Compared with the transconductance amplifier stage 43 illustrated in FIG. 6, the transconductance amplifier stage SSi illustrated in FIG. 21 is the same except that the size (a ratio of channel width to channel length, W/L) of MOS transistors NQ2, NQ4, NQ1, and NQ3 is the i-th power of two ($2^i$) times as large. Therefore, the same reference number is attached to the corresponding component, and the detailed explanation thereof is omitted.

Parasitic capacitance Cg exists between a gate and a drain of each of the MOS transistors NQ2 and NQ4. Therefore, even when the control word bit WC<i> is "0" and a MOS transistor NQ5 for equalizing is in ON state, since an input signal Vin is a high-frequency signal, a signal corresponding to the input signal Vin is transmitted to nodes 66a and 66b via the parasitic capacitance Cg, and the leakage current flows through the output nodes 60a and 60b.

Figure 22A:
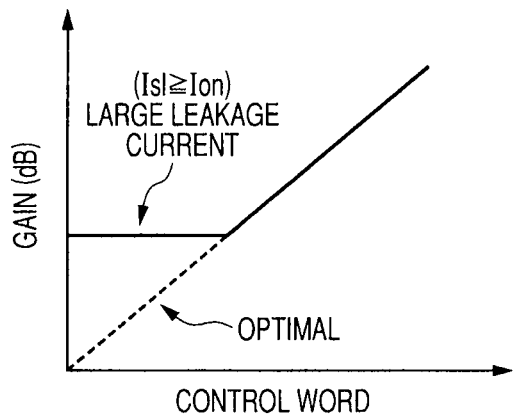
FIG. 22 (A) is a drawing illustrating an output gain characteristic of the variable gain driver illustrated in FIG. 20.
Figure 22B:
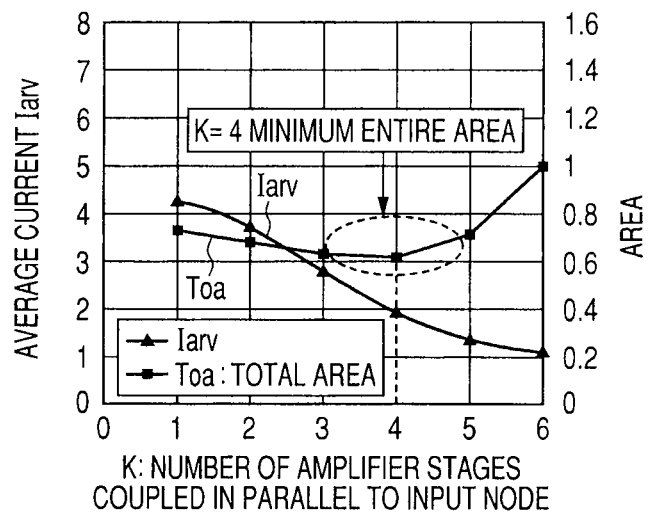
Figure 22C:
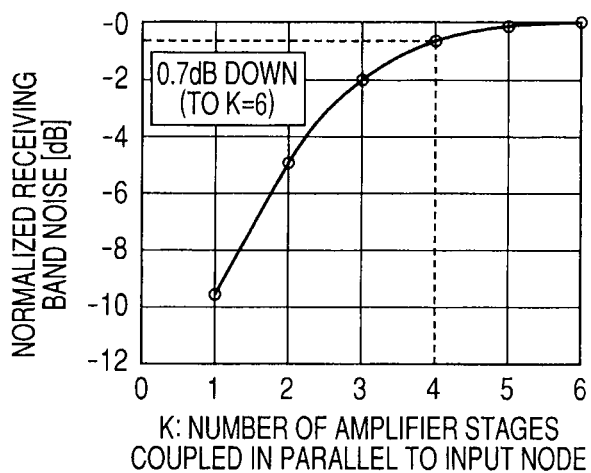

In the present case, it becomes difficult to perform the gain control when the sum total Isl of the leakage current in the transconductance amplifier stages in a disabled state becomes comparable to the amount of supply current Io of the transconductance amplifier stages in an enabled state, as illustrated in FIG. 22 (A). Accordingly, it becomes difficult to control the gain at the time of a low output power. Therefore, in order to adjust the gain with a good controllability at the time of a low output power gain as illustrated by a dashed line in FIG. 22 (A), the configuration of the variable gain driver illustrated in FIG. 21 is unsuitable. Although the MOS transistor NQ5 for equalizing is provided in order to reduce such leakage current, when the number of the transconductance amplifiers increases, the influence of the leakage current due to the transmission of the input signal to the internal nodes 66a and 66b through the capacity coupling becomes difficult to disregard.

In the configuration illustrated in FIG. 21, it is necessary to arrange many transconductance amplifiers which have the basic transconductance gm, leading to an increase of the occupied area.

As indicated by a dashed straight line in FIG. 22 (A), the gain profile is required to have the linearity such that the gain varies linearly over a wide range. In order to realize the linearity of the gain profile without increasing a consumption current, conditions exist in the number of resistor stages of an R-2R ladder network and the number of transconductance amplifiers coupled in parallel to the input node Nn. As other determining factors of the number of stages of the transconductance amplifiers coupled in parallel to the input node Nn, there are receiving band noise and consumption current. The number of amplifier stages coupled in parallel to the input node is determined taking into consideration these factors.

FIG. 22 (B) illustrates behavior of the occupied area of the variable gain driver and the in-transmission average current, as a function of the number of transconductance amplifier stages K, coupled in parallel to the input node. In FIG. 22 (B), the horizontal axis indicates the number of amplifier stages K, and the vertical axis indicates the in-transmission average current Iary and the total occupied area Toa. The transconductance amplifier stages coupled in parallel to the input node are sequentially increased in gain by two times. That is, the configuration illustrated in FIG. 12 is used as the configuration of the variable gain driver.

As illustrated in FIG. 22 (B), the in-transmission average current Iary decreases in proportion as the number of the transconductance amplifier stages K coupled to the input node K increases. On the other hand, the total occupied area Toa reaches a minimum when K is 4, and increases in proportion as the number of amplifier stages K increases.

FIG. 22 (C) illustrates relationship of the number of transconductance amplifier stages coupled to the input node and the receiving band noise. In FIG. 22 (C), the horizontal axis indicates the number of the amplifier stages K coupled in parallel to the input node, as in FIG. 22 (B), and the vertical axis indicates the normalized receiving band noise in dB. The receiving band noise indicates a noise of a reception signal frequency band included in a transmitting signal transmitted to the antenna. Increase of the receiving band noise will reduce reception sensitivity. Also in FIG. 22 (C), the configuration illustrated in FIG. 12 is used as the configuration of the variable gain driver, and the transconductance amplifier stages coupled to the input node are sequentially increased in gain every two times.

As illustrated in FIG. 22 (C), the receiving band noise increases in proportion as the number of the amplifier stages K increases, and when the number of the amplifier stages K reaches six, the receiving band noise is saturated nearly. In this case, when the number of the amplifier stages K coupled to the input node Nn increases from one to six, the receiving band noise deteriorates about 10 dB. Based on the average current, the occupied area, and the receiving band noise characteristics, which are illustrated in FIG. 22 (B) and FIG. 22 (C), the number of the transconductance amplifier stages K coupled in parallel to the input node is set as K=4, although the receiving band noise deteriorates about 0.7 dB.

Figure 23:
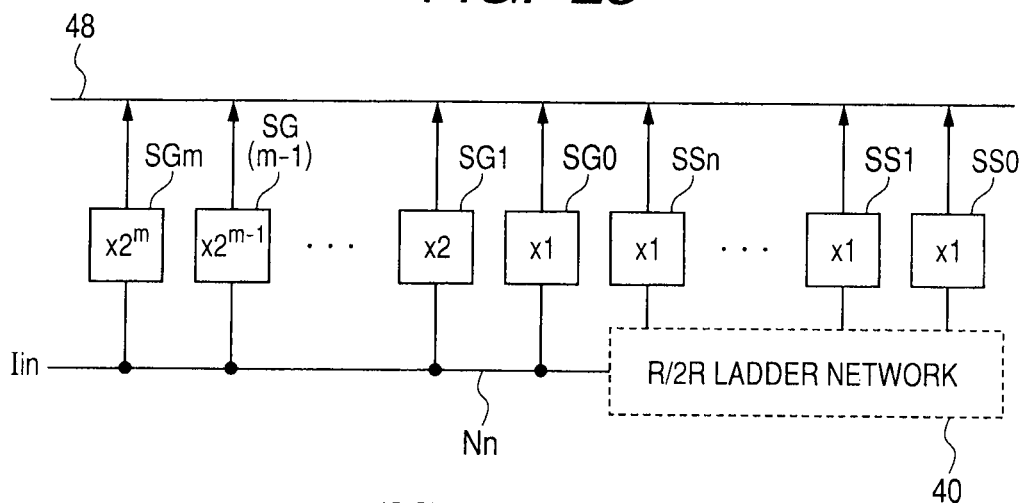
FIG. 23 is a drawing illustrating schematically a configuration of the variable gain driver in modified example 2 according to Embodiment 3 of the present invention.

FIG. 23 illustrates schematically a configuration of the principal part of the variable gain driver in modified example 2 according to Embodiment 3 of the present invention. In FIG. 23, transconductance amplifier stages SG0-SGm are provided in parallel with the input node Nn. Transconductance amplifier stages SS0-SSn are provided corresponding to each node of an R-2R ladder network 40 coupled to the input node Nn. The transconductance amplifier stages SG0-SGm are sequentially increased in transconductance gm every two times. Therefore, a transconductance amplifier stage SGi has gain of magnitude of the i-th power of two ($2^i$).

As explained in the above with reference to FIG. 22 (A)-FIG. 22 (C), in the variable gain driver illustrated in FIG. 23, in order to realize the linearity of the gain profile, an ON-state current Ion at the time of a low output power needs to be larger than a total leakage current Isl of the transconductance amplifier stages in a disabled state. In the transconductance amplifier stages SG0-SGm coupled to the output node Nn, the amplitude of an input signal is large and the influence of the leakage current due to capacity coupling is large. In the transconductance amplifier stages SS0-SSn provided to the R-2R ladder network 40, the amplitude of the input voltage amplitude is small and the amount of leakage current is small. Therefore, taking into consideration the amount of consumption current, the in-transmission average current, the occupied area, and the receiving band noise, the number m is set as m=3 when the maximum gain is 96 dB, and the transconductance amplifier stages SG0-SG3 are coupled in parallel to the input node. In the present case, as for the transconductance amplifier stages provided to the R-2R ladder network 40, the control word WC<21:0> is supplied, the number n is set as n=18, and the transconductance amplifier stages SS0-SS18 are provided. Accordingly, it is possible to realize the variable gain driver which has low power consumption, a small occupied area, a low receiving band noise, and a linear gain profile.

As described above, according to Embodiment 3 of the present invention, the transconductance amplifiers are coupled in parallel to the input node of the R-2R ladder network, and the number of resistor stages of the R-2R ladder network is reduced. According to the configuration, it is possible to realize the variable gain driver which has the low power consumption and the gain profile of an excellent linearity.

Embodiment 4

Figure 24:
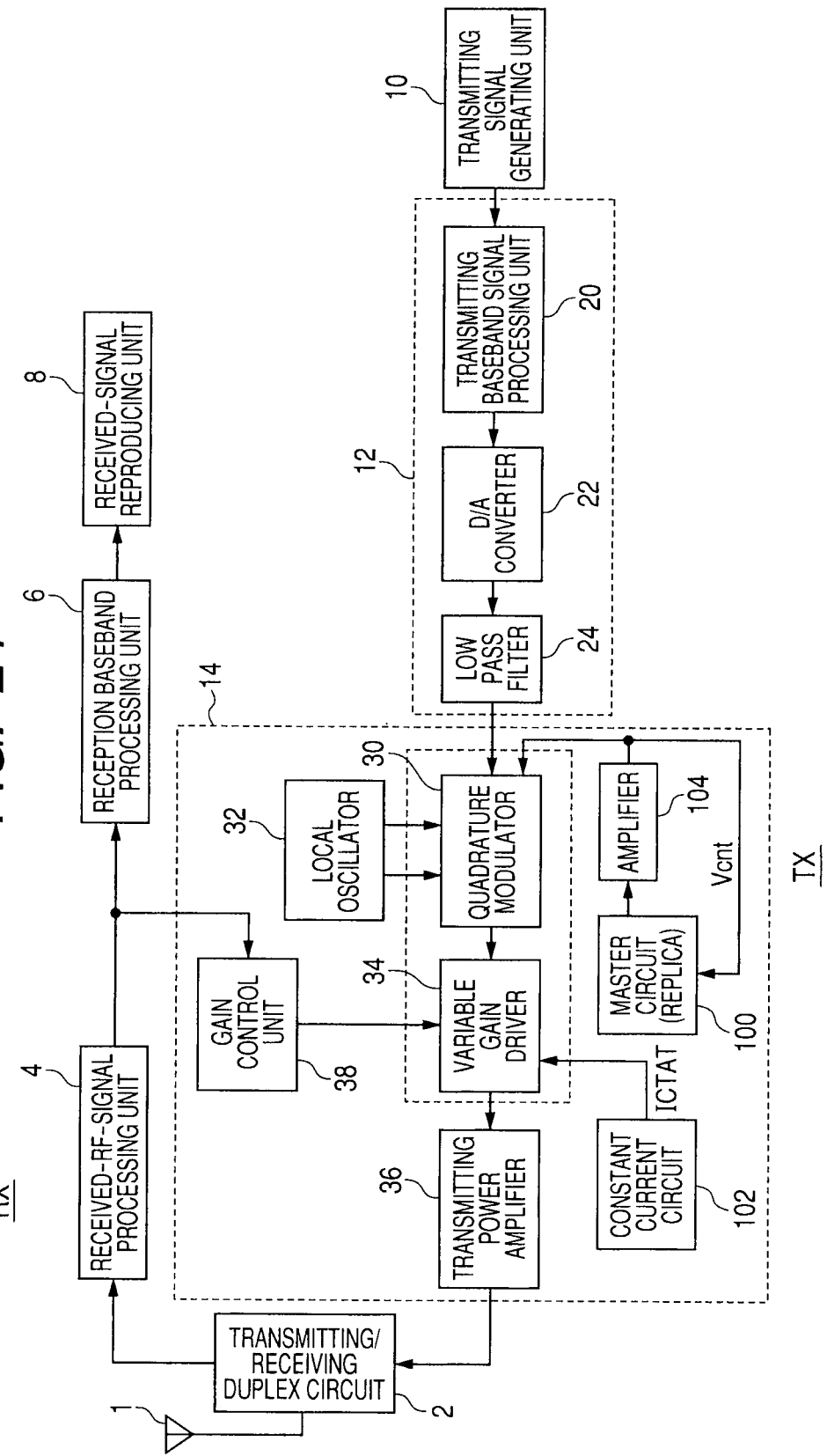
FIG. 24 is a drawing illustrating schematically an entire configuration of a communication terminal according to Embodiment 4 of the present invention.

FIG. 24 illustrates schematically an entire configuration of a mobile terminal according to Embodiment 4 of the present invention. The mobile terminal illustrated in FIG. 24 differs in configuration from the mobile terminal illustrated in FIG. 1 in the following point. That is, in the transmitting-RF-signal processing unit 14, a master circuit 100 is provided to the quadrature modulator 30 and the variable gain driver 34. The quadrature modulator 30 and the variable gain driver 34 form a slave circuit 110. The master circuit 100 is a replica circuit of the quadrature modulator 30 and one stage of the transconductance amplifier stage of the variable gain driver 34. The master circuit 100 has the same configuration as the quadrature modulator 30 and one stage of the transconductance amplifier stage in the slave circuit 110, and the element size and current are reduced by the same ratio.

An output signal of the master circuit 100 is amplified by a differential difference amplifier 104, to generate a control signal Vcnt. According to the control signal Vcnt, gain of the quadrature modulator 30 and the replica circuit of the quadrature modulator 30 included in the master circuit 100 is adjusted. A constant current circuit 102 generates a constant current ICTAT which is independent of temperature, and specifies the operating current of the transconductance amplifier of the variable gain driver 34 and the operating current of the replica amplifier stage of the master circuit.

The other configuration of the mobile terminal illustrated in FIG. 24 is the same as that of the mobile terminal illustrated in FIG. 1, Therefore, in FIG. 24, the same reference symbol is attached to the component corresponding to the component of the configuration illustrated in FIG. 1 and the detailed explanation thereof is omitted.

In Embodiment 4 of the present invention, according to the output signal of the replica amplifier stage included in the master circuit 100, the control signal Vcnt is generated, and the gain of the quadrature modulator 30 and the output gain of the slave circuit 110 are adjusted. Accordingly, the temperature dependence of the gain is suppressed.

Figure 25:
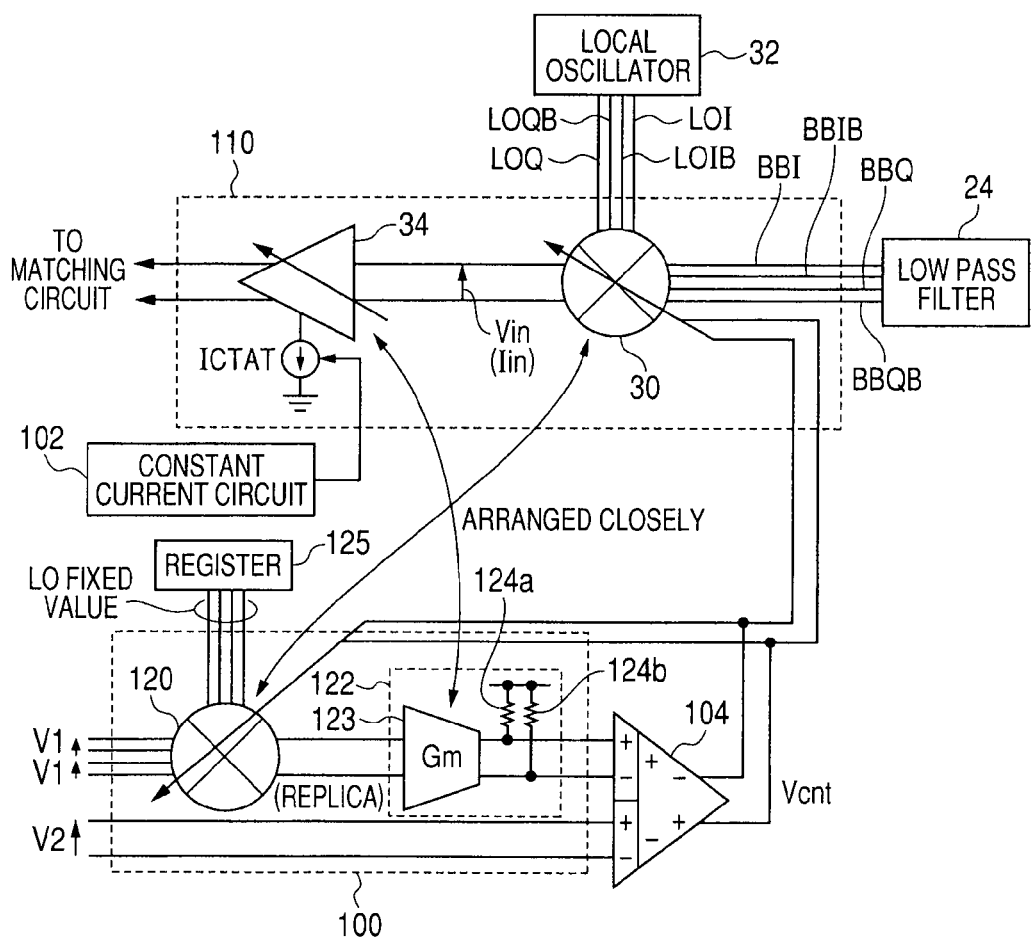
FIG. 25 is a drawing illustrating schematically a configuration of a master circuit and a slave circuit, illustrated in FIG. 24.

FIG. 25 illustrates more specifically the configuration of the master circuit 100 and the slave circuit 110 which are illustrated in FIG. 24. In the slave circuit 110, oscillation signals LOI, LOIB, LOQ, and LOQB from the local oscillator 32 are supplied as carrier signals to the quadrature modulator 30.

On the other hand, baseband signals BBI, BBIB, BBQ, and BBQB are generated from the low pass filter 24, and supplied to the quadrature modulator 30. The gain of the quadrature modulator 30 is adjusted according to the control signal Vcnt outputted by the differential difference amplifier 104. The quadrature modulator 30 modulates the oscillation signals from the local oscillator 32 with the baseband signals supplied from the low pass filter 24.

The operating current of the variable gain driver 34 is set up according to the current ICTAT generated by the constant current circuit 102. The present variable gain driver 34 has the configuration illustrated in any one of Embodiment 1-Embodiment 3.

The master circuit 100 includes a replica modulator 120 which is a replica circuit of the quadrature modulator 30, and a replica driver 122 which amplifies an output signal of the replica modulator 120. In the replica modulator 120, the size of an element of the quadrature modulator 30 of the slave circuit 110 and a driving current are reduced at the same rate. The replica modulator 120 is arranged in proximity to the quadrature modulator 30 as much as possible, so that the same operating characteristic may be realized in the quadrature modulator 30 and in the replica modulator 120.

The replica driver 122 has a one-stage transconductance amplifier (Gm; hereafter called a replica amplifier) 123, and load resistors 124a and 124b provided in the output of the replica amplifier 123. The transconductance amplifier 123 of the replica driver 122 has the same configuration as one stage of the transconductance amplifier stages included in the variable gain driver 34, and the element size and the driving current are reduced at the same rate. The present replica amplifier 123 is arranged in proximity to the transconductance amplifier of the variable gain driver 34 as much as possible, so that the same operating characteristic may be realized in the replica amplifier 123 and the transconductance amplifier stage.

To the replica modulator 120, an LO fixed value from the register 125 is supplied, and a DC (direct current) voltage V1 of constant magnitude is supplied in stead of the baseband signal. The DC voltage V1 is generated using the constant current of the constant current circuit 102 as explained later, and used in stead of a difference BBI-BBIB and a difference BBQ-BBQB of the baseband signals.

As for the oscillation signals from the local oscillator 32, the LO fixed value from the register 125 is set statically to H level for LOI and LOQ and to L level for LOIB and LOQB, or set to L level for LOI and LOQ and to H level for LOIB and LOQB.

The differential difference amplifier 104 is formed using the well-known configuration, and amplifies differentially and inverts an amplified signal of the output signal of the replica driver 122 and an amplified signal of the input DC voltage V2. The control signal Vcnt which the present differential difference amplifier 104 outputs is fed back to the replica modulator 120 as a control signal again. The DC voltage V2 has a constant magnitude and is generated using the constant current of the constant current circuit 102.

Figure 26:
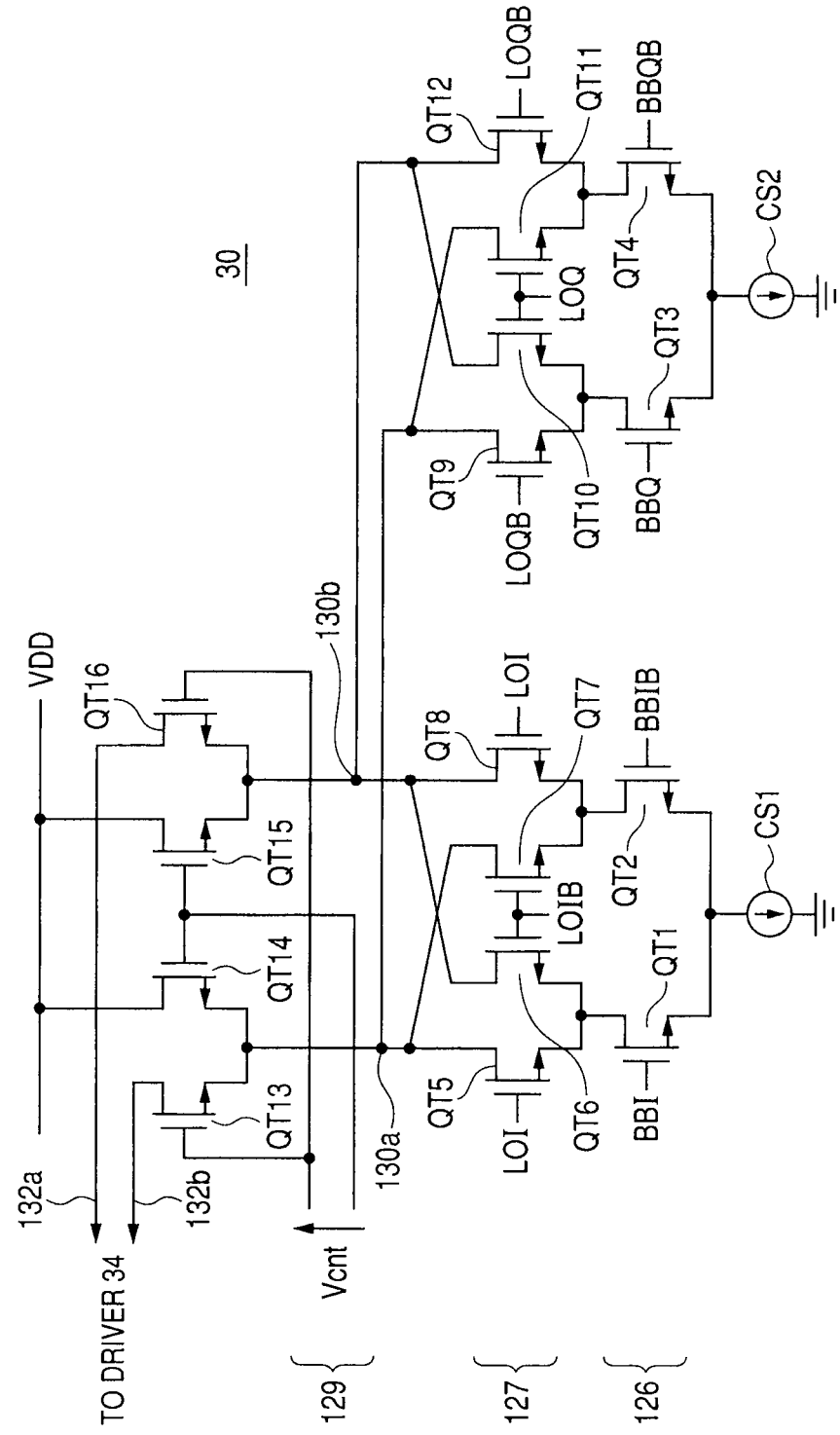
FIG. 26 is a drawing illustrating a configuration of a quadrature modulator illustrated in FIG. 25.

FIG. 26 illustrates an example of the configuration of the quadrature modulator 30 and the replica modulator 120 illustrated in FIG. 25. The quadrature modulator 30 is formed by a Gilbert cell circuit (active mixer), and a baseband input stage 126, an output switching stage 127, and a gain control stage 129 are stacked vertically between the power node and the ground node (constant current source).

The baseband input stage 126 includes N-channel MOS transistors QT1 and QT2 of which each source is coupled to the constant current source CS1, and N-channel MOS transistors QT3 and QT4 of which each source is coupled to the constant current source CS2. The baseband signals BBI and BBIB are supplied to gates of the MOS transistors QT1 and QT2, respectively, and the baseband signals BBQ and BBQB are supplied to gates of the MOS transistors QT3 and QT4, respectively.

The output switching stage 127 includes N-channel MOS transistors QT5 and QT6 of which each source is coupled to a drain of the MOS transistor QT1, N-channel MOS transistors QT7 and QT8 of which each source is coupled to a drain of the MOS transistor QT2, N-channel MOS transistors QT9 and QT10 of which each source is coupled to a drain of the MOS transistor QT3, and N-channel MOS transistors QT11 and QT12 of which each source is coupled to a drain of the MOS transistor QT4.

The MOS transistors QT5 and QT6 receive at respective gates the oscillation signals LOI and LOIB from the local oscillator 32. The MOS transistors QT7 and QT8 receive at respective gates the oscillation signals LOIB and LOI. The MOS transistors QT9 and QT10 receive at respective gates the oscillation signals LOQB and LOQ. The MOS transistors QT11 and QT12 receive at respective gates the oscillation signal LOQ and LOQB. Drains of the MOS transistors QT5, QT8, QT9, and QT11 are coupled to an internal node 130a. Drains of the MOS transistors QT6, QT8, QT10, and QT12 are coupled to an internal node 130b.

The gain control stage 129 includes N-channel MOS transistors QT13 and QT14 of which each source is coupled to the internal node 130a, and N-channel MOS transistors QT15 and QT16 of which each source is coupled to the internal node 130b.

The control signal Vcnt is supplied between gates of the MOS transistors QT13 and QT14, and the control signal Vcnt is supplied between gates of the MOS transistors QT16 and Q15. Drains of the MOS transistors QT14 and QT15 are coupled to the power node and supplied with a power supply voltage VDD. The MOS transistors QT13 and QT16 are coupled to output nodes 132b and 132a, respectively, generate an input current to the variable gain driver 34 in the following stage.

What is required in particular for the quadrature modulator 30 is to expand the input amplitude and the output amplitude as large as possible. This is for enlarging carrier-to-noise ratio CNR of an output noise. The reason why a large carrier-to-noise ratio CNR is preferred comes from the fact that in FDD (Frequency Division Duplex) such as the third-generation mobile phone standard WCDMA, it is desirable to prevent degradation of reception sensitivity due to the output noise of a transmitting-signal output system intervening to a receiving system. Here, in the FDD system, different frequency bands are allocated to transmission and reception, and the transmission and the reception are performed at the same time.

The constant current sources CS1 and CS2 maybe omitted for expanding the input amplitude. As the MOS transistors QT1-QT4 in the baseband input stage 126, a high-withstand voltage transistor is selected generally in order to receive a large amplitude input. The MOS transistors QT5-QT12 included in the output switching stage 127 are required to switch at high speed. The highest-speed transistor (a MOS transistor of a thin gate insulating film or a MOS transistor of a low threshold voltage) is used among the selectable process systems, and the withstand voltage thereof is low compared with the MOS transistors QT1-QT4 of the baseband signal input stage 126.

The gain control stage 129 prevents a high voltage from being applied to the MOS transistors QT5-QT12 of a high-speed low-withstand voltage, included in the output switching stage 127. At the same time, the gain control stage 129 performs the gain control according to the control signal Vcnt. As the MOS transistors QT13-QT16 of the gain control stage 129, a high-withstand voltage MOS transistor is used in order to generate a high power.

In the quadrature modulator 30 illustrated in FIG. 26, a multiplication signal of the baseband signals BBI-BBIB and the local oscillation signals LOI-LOIB is generated between the internal nodes 130a and 130b by the MOS transistors QT1, QT2, and QT5-QT8. Similarly, a multiplication signal of the baseband signal BBQ-BBQB and the local oscillation signals LOQ-LOQB is generated between the internal nodes 130b and 130a by the MOS transistors QT3, QT4, and QT9-QT12. Accordingly, a signal which the local oscillation signals LOI, LOIB, LOQB, and LOQ as the carriers are quadrature-modulated with the baseband signal is generated at the internal nodes 130a and 130b.

In the gain control stage 129, the amplitude of the output signal to be transmitted to the output nodes 132a and 132b is adjusted, by adjusting the gain according to the gain control signal Vcnt.

Figure 27:
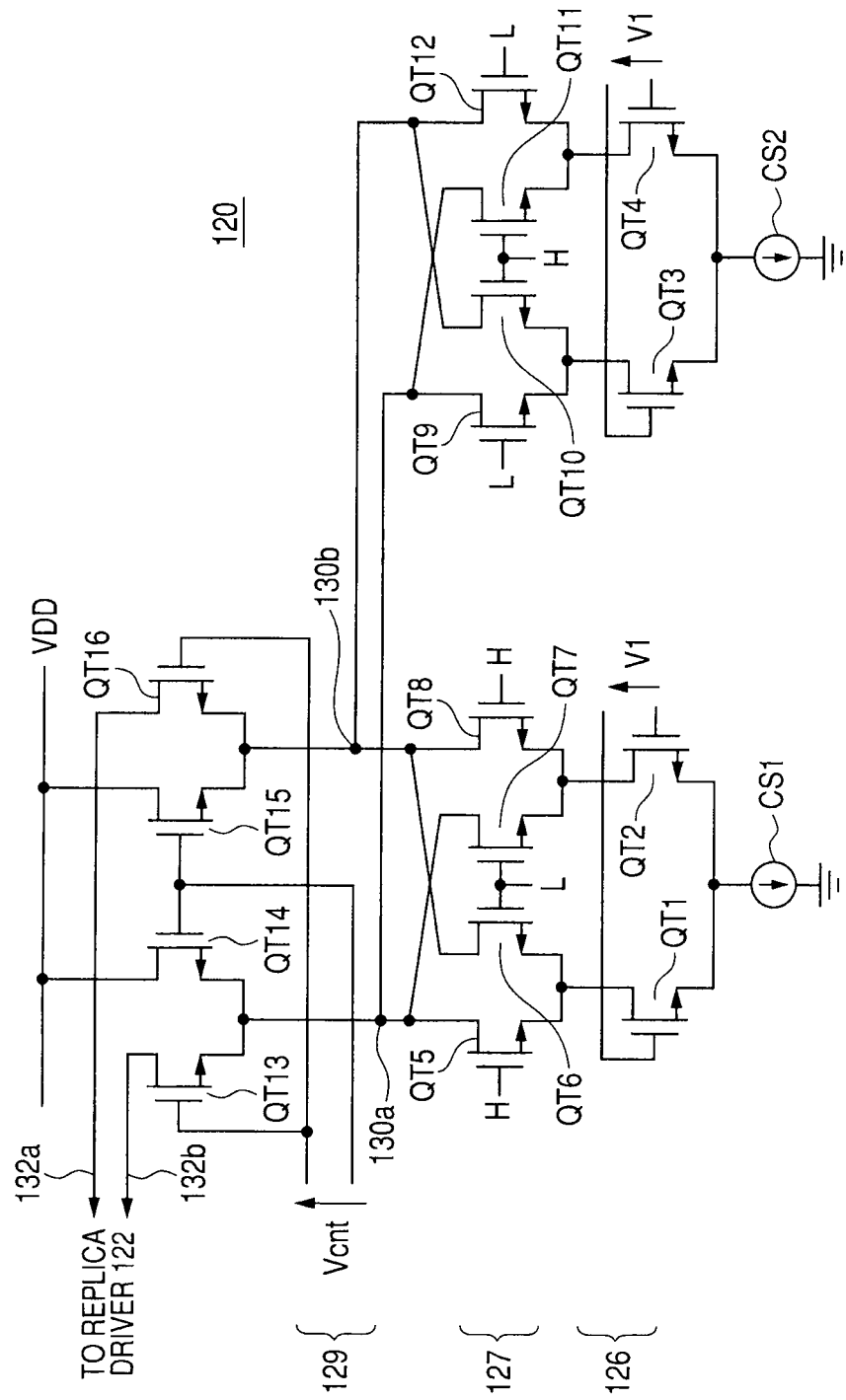
FIG. 27 is a drawing illustrating schematically a configuration of a replica modulator illustrated in FIG. 25.

FIG. 27 illustrates schematically a configuration of the replica modulator 120 illustrated in FIG. 25. The replica modulator 120 has the same configuration as that of the quadrature modulator 30 illustrated in FIG. 26, and the size of the transistor elements and the amount of driving current are only reduced. Therefore, in the replica modulator illustrated in FIG. 27, the same reference number is attached to the component corresponding to the component of the quadrature modulator 30 illustrated in FIG. 26, and the detailed explanation thereof is omitted.

In the baseband signal input stage 126 of the replica modulator 120, the DC voltage V1 is supplied between gates of the MOS transistors QT1 and QT2, and the DC voltage V1 is supplied also between gates of the MOS transistors QT3 and QT4.

In the output switching stage 127, a signal of H level is supplied to gates of the MOS transistors QT5, QT8, QT10, and QT11, and a signal of L level is supplied to gates of the MOS transistors QT6, QT7, QT9, and QT12. In the output switching stage 127, the H level and the L level of the signal supplied to the gate of each MOS transistor may be reversed.

In the gain control stage 129, the gain of an output signal is adjusted according to the gain control signal Vcnt.

From the replica modulator 120, a voltage modulated corresponding to the DC voltage V1 and the gain control signal Vcnt is supplied to the output nodes 132a and 132b. That is, in the configuration illustrated in FIG. 27, the MOS transistors QT5, QT8, QT10, and QT11 are maintained in ON state, a voltage corresponding to the DC voltage V1 and corresponding to the current which flows through the constant current sources CS1 and CS2 are generated at the nodes 130a and 130b. In the present case, the voltage levels at the nodes 130a and 130b become the same level.

The MOS transistors QT14 and QT15 supply current to the nodes 130a and 130b from the power node, respectively, and the amount of current which flows the MOS transistors QT13 and QT16 is set up according to the gain control signal Vcnt. Correspondingly, the amount of current which flows through the output nodes 132a and 132b is set up. Therefore, the amount of current which flows through each of the constant current sources CS1 and CS2 is the same, and the current of the same magnitude flows through the output nodes 132a and 132b (the voltage of the same magnitude appears).

The output signal of the replica modulator 120 is supplied to the replica driver 122, and further amplified and supplied to a first differential input of the differential difference amplifier 104. The DC voltage V2 is supplied to the other differential input of the differential difference amplifier 104.

The differential difference amplifier 104 performs differential amplification to the output signal of the replica driver 122 and the differential signal V2 to generate the gain control signal Vcnt. The gain control of the replica modulator 120 is performed by the negative feedback of the gain control signal Vcnt. Therefore, when the gain of the replica modulator 120 and the replica driver 122 is expressed as Gain(replica), relationship given by the following equation holds after stabilization: $V1 \cdot Gain(replica) = V2$.

That is, the total gain of the replica modulator 120 and the replica driver 122 in the master circuit 100 is derived from the above equation as followings: Gain (replica)=V2/V1.

The DC voltages V1 and V2 are both fixed, and the gain of the master circuit 100 becomes constant.

The gain control signal Vcnt from the differential difference amplifier 104 is supplied also to the quadrature modulator 30 of the slave circuit 110. The replica modulator 120 and the replica driver 122 are replica circuits of the transconductance amplifier stage of the quadrature modulator 30 and the variable gain driver 34, and their operating characteristics are the same. Therefore, the total gain of the quadrature modulator 30 and one stage of the enabled transconductance amplifier stage of the variable gain driver 34 becomes constant. In order to maintain the maximum output level of the variable gain driver 34, bias is applied by the temperature-independent current ICTAT from the constant current circuit 102. Hereafter, the reason for setting constant the total gain of the quadrature modulator 30 and one stage of the transconductance stage is explained.

Figure 28:
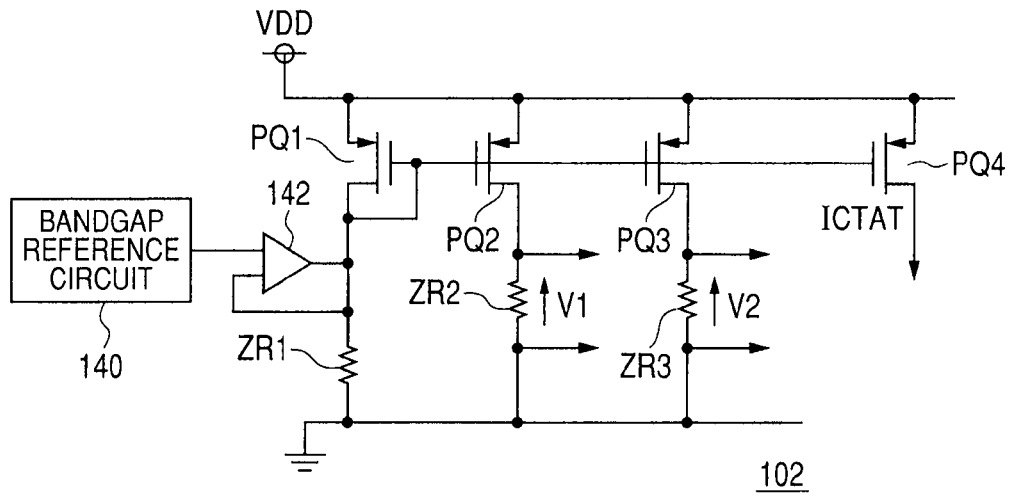
FIG. 28 is a drawing illustrating schematically a configuration of a constant current circuit illustrated in FIG. 24.

FIG. 28 illustrates schematically an example of a configuration of the constant current circuit 102 illustrated in FIG. 25. In FIG. 28, the constant current circuit 102 includes a bandgap reference circuit 140, a voltage follower 142 which performs buffering of an output voltage of the bandgap reference circuit 140, P-channel MOS transistors PQ1

PQ4 coupled to the power node, and resistance elements ZR1

ZR3 coupled in series between the MOS transistors PQ1-PQ3 and the ground node, respectively.

The bandgap reference circuit 140 is realized using the publicly known configuration and generates a constant voltage which is independent of temperature. The voltage follower 142 performs impedance conversion of the band gap referential circuit 140, and maintains the voltage level of a connection node of the MOS transistor PQ1 and the resistance element ZR1 to the constant voltage level which the bandgap reference circuit 140 generates, with a large current drive power.

A gate and a drain of the P-channel MOS transistor PQ1 are intercoupled, and gates of the P-channel MOS transistors PQ1-PQ4 are intercoupled. Therefore, the MOS transistors PQ1-PQ4 form a current mirror circuit, and a mirror current of current which flows via the MOS transistor PQ1 flows through each of the P-channel MOS transistors PQ2-PQ4. A gate-to-source voltage of the MOS transistor PQ1 is constant, correspondingly, the MOS transistor PQ1 supplies the constant current.

A voltage V1 corresponding to the current from the MOS transistor PQ2 and a value of resistance of the resistance element ZR2 is generated between both ends of the resistance element ZR2. A voltage V2 corresponding to the current from the MOS transistor PQ3 and a value of resistance of the resistance element ZR3 is generated between both ends of the resistance element ZR3. Therefore, a ratio of the voltage V1 to the voltage V2, V1/V2, has a constant value independent of temperature, since the MOS transistors PQ2 and PQ3 have the same characteristic and the resistance elements ZR3 and ZR2 have the same characteristic. From the MOS transistor PQ4, the constant current ICTAT which is independent of temperature is outputted.

Figure 29:
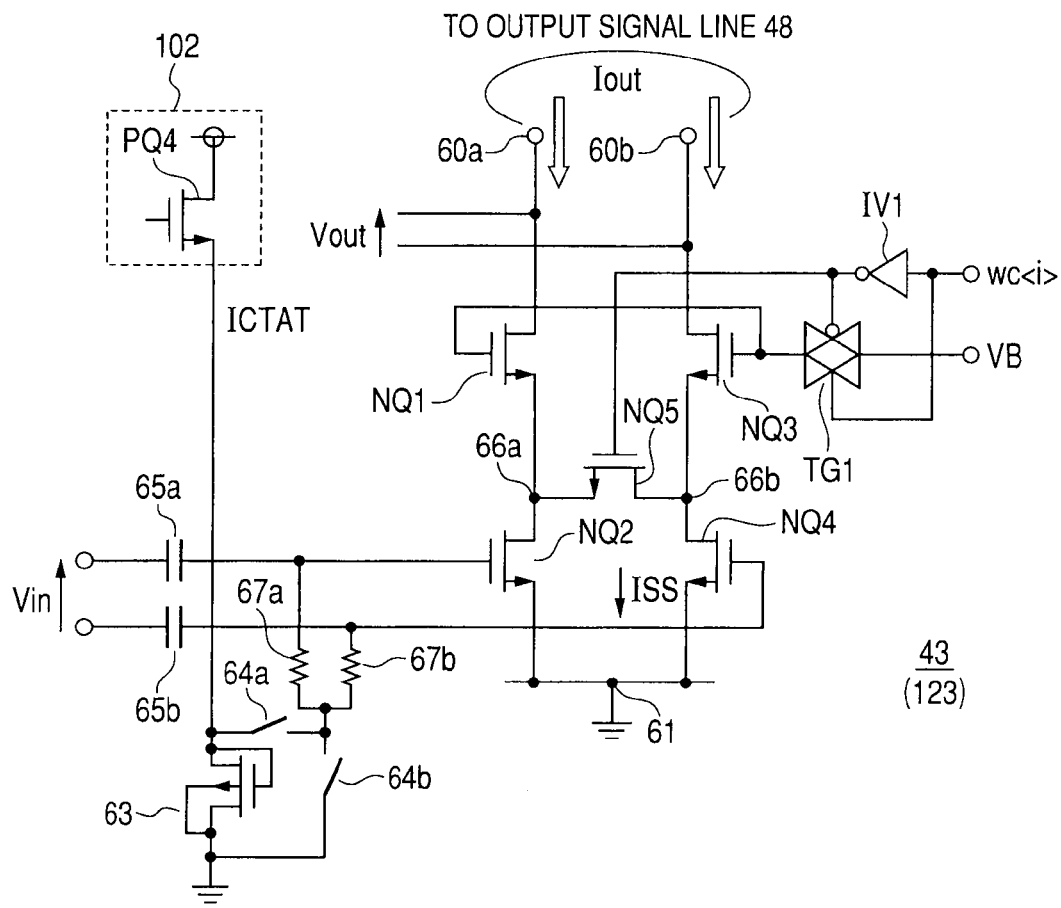
FIG. 29 is a drawing illustrating schematically a configuration of a variable gain driver and a replica amplifier stage, illustrated in FIG. 25.

FIG. 29 illustrates a specific configuration of the transconductance amplifier stages 43 and 123 included in the replica driver 120 and the variable gain driver 34. In the configuration illustrated in FIG. 29, the constant current ICTAT to be supplied to the N-channel MOS transistor 63 in the configuration of the transconductance amplifier stage 43 illustrated in FIG. 6 is supplied from the constant current circuit 102. The same reference number is attached to the corresponding component in the transconductance amplifier stage (or replica amplifier) illustrated in FIG. 29 and in the configuration of the amplifier stage 43 illustrated in FIG. 6, and the detailed explanation thereof is omitted.

The current ICAT supplied to the MOS transistor 63 is a constant current independent of temperature. An output signal (voltage or current) of the quadrature modulator 30 or the replica modulator 120 is supplied to gates of the MOS transistors NQ2 and NQ4. In FIG. 29, a voltage Vin is illustrated as the input signal.

A gate bias voltage of the MOS transistors NQ2 and NQ4 is set up by a voltage which is determined by the constant current ICTAT flowing through the MOS transistor 63 and by a value of resistance of the bias resistance elements 67a and 67b. The input signal Vin is superposed on the gate bias voltage. Total current ISS of current which flows through each of the MOS transistors NQ2 and NQ4 is proportional to the gate bias of the MOS transistors NQ2 and NQ4 (the amount of current which flows through one of the output nodes 60a and 60b increases corresponding to the amplitude and the sign of the input signal Vin). Therefore, the total current ISS is proportional to the constant current ICAT.

Figure 30:
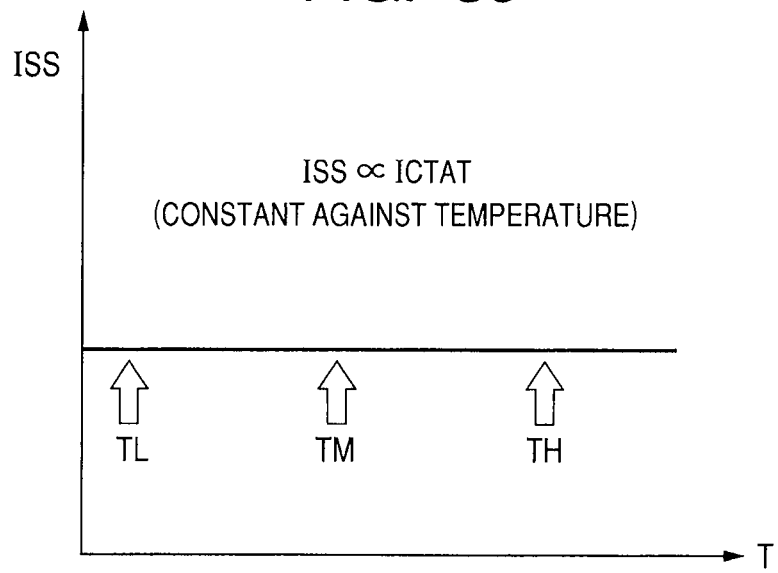
FIG. 30 is a drawing illustrating temperature dependence of an operating current of the amplifier stage illustrated in FIG. 29.

Therefore, as illustrated in FIG. 30, the operating current ISS which flows via the transconductance amplifier stage (or replica amplifier) becomes a constant current which is proportional to constant current ICTAT and is independent of temperature, over the range of a low temperature range TL, a middle temperature range TM, and a high temperature range TH. In FIG. 30, the horizontal axis indicates temperature and the vertical axis indicates the operating current ISS.

Figure 31:
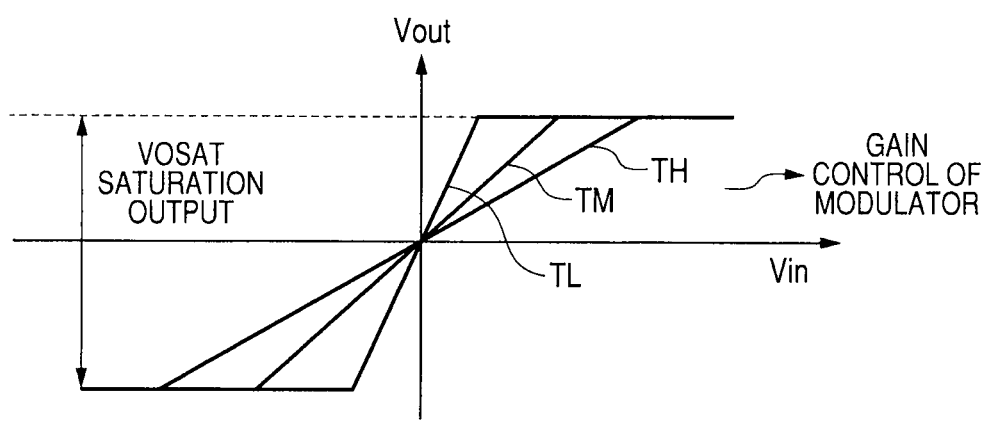
FIG. 31 is a drawing illustrating temperature dependence of input-output characteristics of the amplifier stage illustrated in FIG. 29.

FIG. 31 illustrates the temperature dependence of the input-output characteristics of the transconductance amplifier stage 43 or the replica amplifier 123, illustrated in FIG. 29. In FIG. 31, the horizontal axis indicates the input voltage Vin, and the vertical axis indicates the output voltage Vout. The output voltage Vout is expressed by the following equation: Vout=V mod·gm·|ZL|.

Here, V mod is an output voltage of the quadrature modulator or the replica modulator, gm is transconductance of the transconductance amplifier stage 43 or the replica amplifier 123, and ZL is an output load of the transconductance amplifier or the replica amplifier. A straight line TL indicates the operating characteristic in the low temperature range, a straight line TM indicates the operating characteristic in the middle temperature range, and a straight line TH indicates the operating characteristic in the high temperature range. Each temperature range corresponds to the temperature range indicated in FIG. 30.

As indicated in FIG. 31, when the current ISS is constant, the transconductance gm falls as temperature rises. This is because that the transconductance gm is proportional to mobility of a carrier and the mobility has a negative temperature characteristic. Therefore, the gain of the transconductance amplifier stage or the replica amplifier decreases at a high temperature as indicated by the straight line TH, and increases at a low temperature as indicated be the straight line TL. At a middle temperature, the gain has the characteristic in the middle of the characteristic at a high temperature and the characteristic at a low temperature, as indicated by the straight line TM.

When the gain of the transconductance amplifier stage decreases at high temperature, the gain of the quadrature modulator in the preceding stage is increased so that the total gain of the quadrature modulator and the variable gain driver or the total gain of the replica modulator and the replica amplifier may be maintained at a constant value according to the gain control signal Vcnt. The total gain of the quadrature modulator and the variable gain driver can be constantly set up independent of temperature by adjusting the gain of the quadrature modulator in the preceding stage and compensating the temperature dependence of the gain of the following stage driver (the variable gain driver or the replica driver). Accordingly, it is not necessary to generate the operating current to the amplifier stage in consideration of the temperature dependence of the gain of the transconductance amplifier. Furthermore, it is possible to utilize a simple circuit configuration as a circuit which supplies the constant current, and to reduce the consumption current. The temperature control of the current also becomes easy.

The saturation output Vosat of the amplifier is given by ISS·|ZL|. The current ISS and the output load ZL have very small temperature dependence. Accordingly, it is possible to maintain the saturation output Vosat constant to temperature, to maintain the maximum output level constant to temperature, and to maintain the gain constant to temperature.

As described above, according to Embodiment 4 of the present invention, with the use of the replica circuit of the quadrature modulator and the variable gain driver, the total gain of the modulator and the driver of the replica circuit is adjusted by the gain control signal Vcnt so that the total gain may become constant, using the constant DC voltage and the constant current without temperature dependence. According to the gain control signal, the total gain of the quadrature modulator and the variable gain driver is adjusted. Accordingly, it is possible to provide a transmission system of which the maximum output level is constant to temperature and of which the gain change can be performed without temperature dependence.

Embodiment 5

Figure 32:
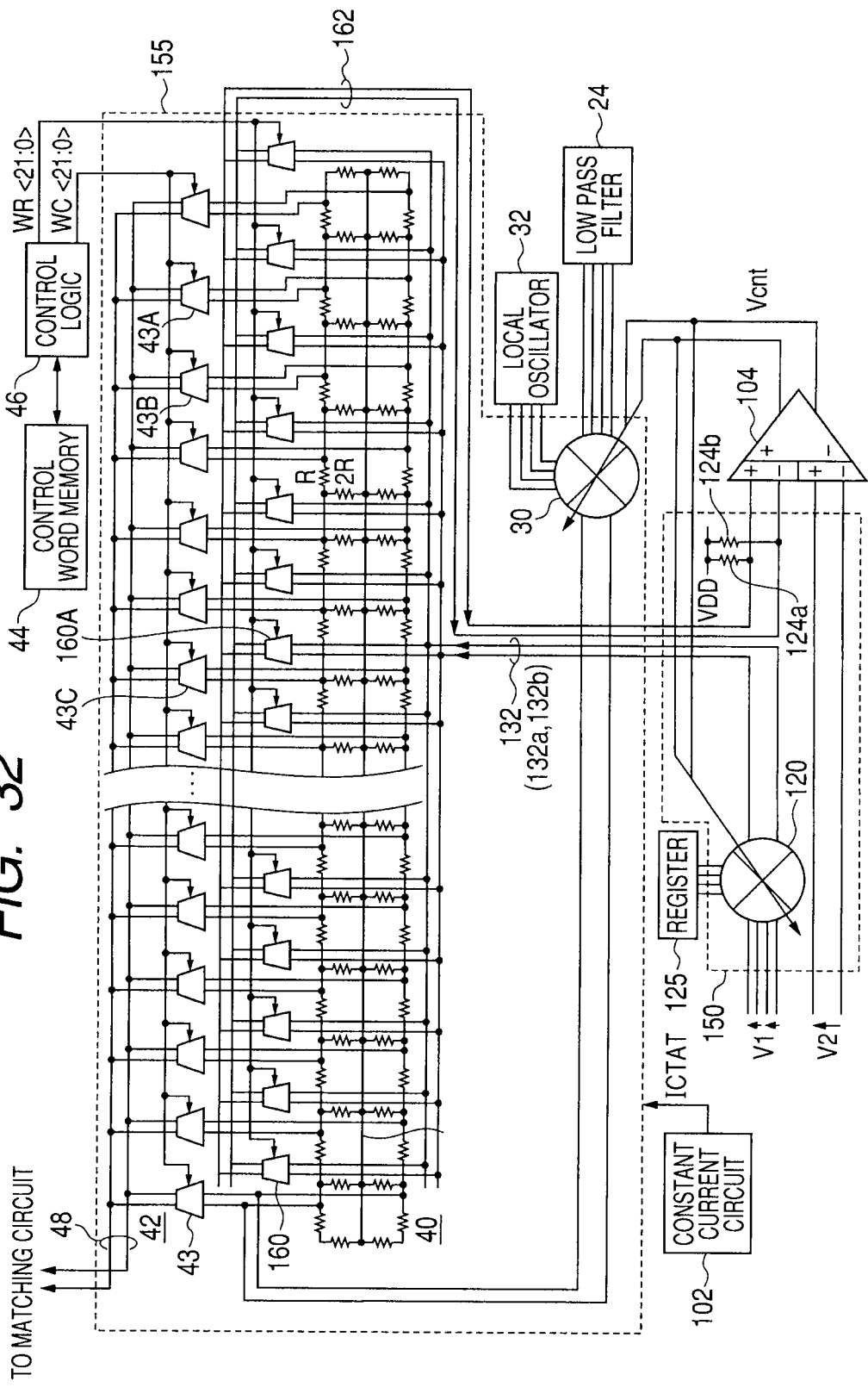
FIG. 32 is a drawing illustrating schematically a configuration of a master circuit and a slave circuit according to Embodiment 5 of the present invention.

FIG. 32 illustrates schematically a configuration of a variable gain driver and a master circuit according to Embodiment 5 of the present invention. Also in the configuration illustrated in FIG. 32, the master circuit 150 and the slave circuit 155 are provided. The slave circuit 155 includes a quadrature modulator 30, a voltage/current conversion unit 42, and an R-2R ladder network 40. In the voltage/current conversion unit 42, a transconductance amplifier stage 43 is provided corresponding to each connection node of the R-2R ladder network 40. To the quadrature modulator 30, an oscillation signal from a local oscillator 32 and a baseband signal from a low pass filter 24 are supplied.

In the master circuit 150, a replica modulator 120 and load resistors 124a and 124b are provided. The replica modulator 120 simulates modulation operation according to an LO fixed value stored in a register 125 and a DC bias voltage V1. The replica modulator 120 is arranged in proximity to the quadrature modulator 30 as in Embodiment 4. The replica modulator 120 is a replica circuit of the quadrature modulator 30, has the element size and the current drive power which are reduced proportionally.

As a replica driver in the master circuit 150, a replica amplifier 160 is provided corresponding to each transconductance amplifier stage 43 in the voltage/current conversion unit 42. The replica amplifier 160 is a replica circuit of the transconductance amplifier stage 43, and has the same configuration and the reduced element size and the reduced current drive power. A constant current ICTAT from a constant current circuit 102 is supplied to the transconductance amplifier stage 43 and the replica amplifier 160. To the replica amplifier 160, an output signal of the replica modulator 120 is supplied in common via a signal line 132 (132a, 132B). An output of the replica amplifier 160 is coupled to a signal line 162 in common. The signal line 162 is coupled to a first differential input of the differential difference amplifier 104 as is the case of Embodiment 4, and load resistors 124a and 124b for current/voltage conversion are provided in the signal line 162.

In order to control the operation of the transconductance amplifier stage 43 and the replica amplifier 160, a control word WC<21:0> and a replica control word WR<21:0> are generated by a control logic 46. The control logic 46 converts a control word wc<21:0> stored in a control word memory 44, and generates the control word WC<21:0> and the replica control word WR<21:0>. As for the control word WR<21:0>, as explained later, the control word WR<5:0> is fixed to "0", since a replica amplifier which is arranged corresponding to a transconductance amplifier stage 43 with the largest gain among the transconductance amplifier stages 43 selected in parallel, is enabled.

The gain control in the slave circuit 155 and the master circuit 150 is the same as the gain control in the configuration according to Embodiment 4. As the replica driver, the replica amplifier 160 is arranged in proximity to the transconductance amplifier stage 43. One replica amplifier 160 which is arranged corresponding to a transconductance amplifier stage receiving a control word of the highest-order bit among the transconductance amplifier stages which receive a control word bit of "1" is set to an enabled state. For example, in FIG. 32, it is assumed that transconductance amplifier stages 43A, 43B, and 43C are in an enabled state. In the present case, the amount of supply current is largest in the transconductance amplifier stage 43C. Therefore, in the present case, a replica amplifier 160A arranged nearest to the transconductance amplifier stage 43C is set to an enabled state.

A transconductance amplifier stage which receives a highest-order control word bit among the control word bit WC<i> set as "1" is an amplifier stage which contributes to the gain most. By arranging the transconductance amplifier stage 43 and the replica amplifier 160 closely each other, influence of process variation becomes the same in the transconductance amplifier stage 43 and the replica amplifier 160 which are arranged closely each other. Therefore, it is possible to suppress effectively the characteristic variation (process-induced gain control variation) of the most dominant transconductance amplifier stage, by adjusting the gain thereof with the use of the replica amplifier arranged in proximity to the transconductance amplifier stage. It is also possible to obtain the same effect as in Embodiment 4.

Figure 33:
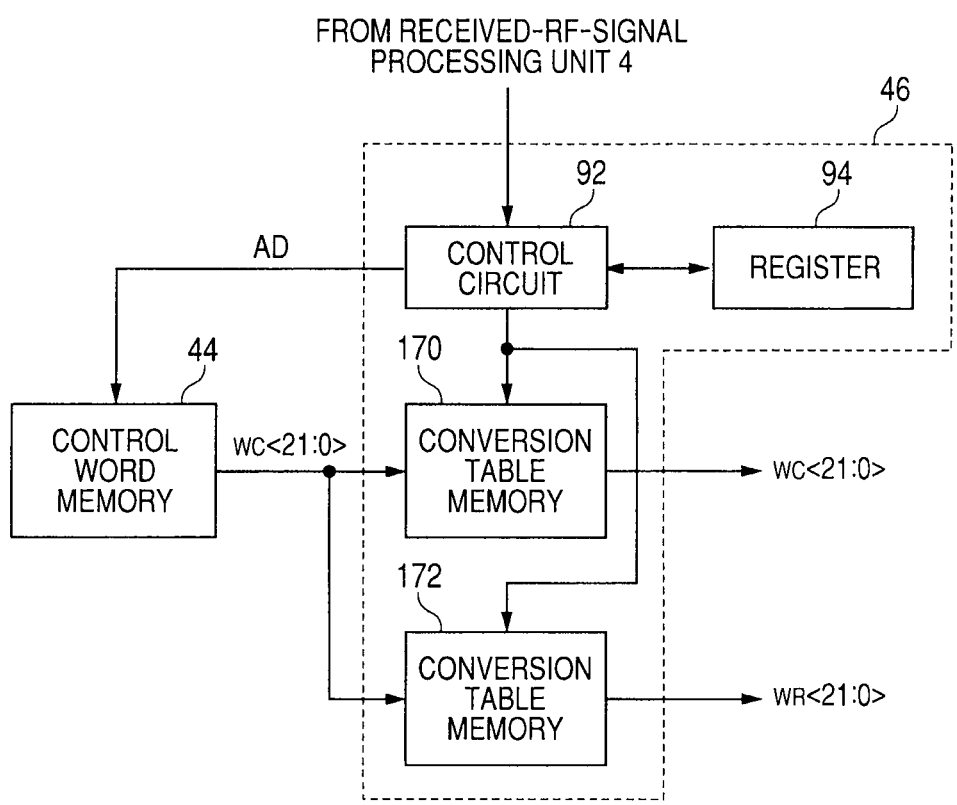
FIG. 33 is a drawing illustrating schematically a configuration of a control logic illustrated in FIG. 32.

FIG. 33 illustrates schematically an example of a configuration of the control logic 46 illustrated in FIG. 32. In FIG. 33, the control logic 46 includes a control circuit 92, a register 94 for storing the present address, and conversion table memories 170 and 172 for converting the control word.

In the same manner as in the configuration illustrated in FIG. 19, the control circuit 92 refers to the present address (decibel value utilized currently) stored in register 94 and generates the address AD which specifies a control word corresponding to the gain of a specified transmitting signal, by detecting the level of a reception signal supplied from the received-RF-signal processing unit 4, or according to a control bit transmitted from the base station. A control word wc<21:0> read from the control word memory 44 is supplied to the conversion table memories 170 and 172. In the same manner as in Embodiment 1, the conversion table memory 170 converts the control word wc<21:0> from the control word memory 44 into the control word WC<21:0> which indicates a linear output, and supplies it to the transconductance amplifier stage 43. On the other hand, the conversion table memory 172 generates a replica amplifier control word WR<21:0> according to the control word wc<21:0> from the control word memory 44.

The conversion table memory 172 sets to "1" only a bit corresponding to "1" of the highest-order bit among the control word wc<21:0> supplied from the control word memory 44. It is based on the following reasons that the lowest-order 6 bits WR<5:0> among the control word WR<21:0> from the conversion table memory 172 is fixed to "0." That is, at the time of the gain of 0 dB, as for the control word WC<21:0>, a bit WC<6> is set to "1", correspondingly, a replica amplifier control word WR<6> is set to "1" and the lower-order gain is not utilized; therefore, it is only required to control enabling/disabling of the replica amplifier of higher order than the control word bit WC<6>.

It is preferable that the conversion table memory 172 generates the replica amplifier control word WR<21:6>, after receiving the control word WC<21:0> from the conversion table memory 170 as an address signal in place of the control word wc<21:0> from the control word memory 44. It is also preferable that, in place of the present conversion table memory 172, a hardware configuration which detects the position of "1" of the highest-order bit of the control word WC<21:0> from the conversion table memory 170 is utilized. In the present case, it is possible to adopt a configuration of a priority encoder which selects an output of a highest priority from an output of a content addressable memory (CAM).

Even if the transconductance amplifier stage has the configuration coupled in parallel to the input node, an accurate gain control can be performed by arranging the replica amplifier corresponding to the parallel transconductance amplifier stage. In the present case, the replica amplifiers corresponding to the transconductance amplifier stages coupled in parallel to the input node are doubled in the respective gain sequentially.

As described above, according to Embodiment 5 of the present invention, the replica amplifier is arranged in proximity to and corresponding to the transconductance amplifier stage of the voltage/current conversion unit, and the replica amplifier arranged in proximity to the transconductance amplifier stage with the greatest contribution to gain is set to an enabled state. Accordingly, the replica amplifier with performance most similar to that of the transconductance amplifier with the greatest contribution to gain can be set to an enabled state, and variation in the gain control induced by variation in a manufacturing process of each amplifier stage can be suppressed. As a result, it is possible to perform an accurate gain control. Due to the accurate gain control realized, a margin of a variable gain range required of the variable gain driver can be reduced, correspondingly, the number of stages of the transconductance amplifier of the variable gain driver can be reduced, and the occupied area and the consumption current can be reduced. Furthermore, it is possible to obtain the same effect as in Embodiment 4.

Embodiment 6

Figure 34:
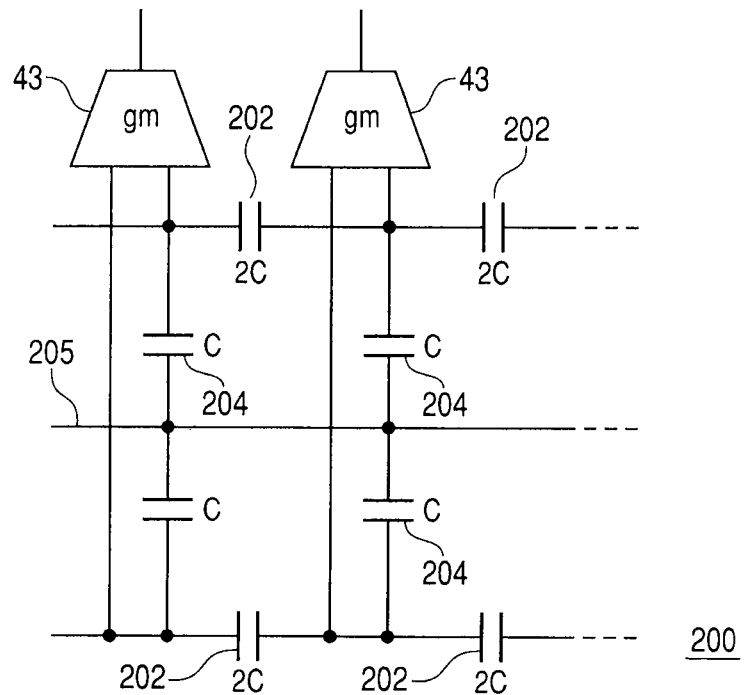
FIG. 34 is a drawing illustrating schematically a configuration of a ladder network included in a variable gain amplifier according to Embodiment 6 of the present invention.

FIG. 34 illustrates schematically a configuration of the principal part of the variable gain driver according to Embodiment 6 of the present invention. In FIG. 34, a 2C-C ladder network 200 is provided as a ladder network which generates a subdivided voltage. In the ladder network 200, a capacitive element 202 of capacity 2C is coupled in series to an input node, and a capacitive element 204 of capacity C is coupled between each voltage dividing node and an AC grounding conductor 205. A transconductance amplifier stage (gm) 43 is coupled corresponding to each voltage dividing node. The other configuration of the variable gain driver illustrated in FIG. 34 is the same as the configuration according to any one of Embodiments 1, 3, 4, and 5.

In the configuration illustrated in FIG. 34, the capacitive elements 202 and 204 are used in place of the resistance elements R and 2R of the R-2R ladder network. Combined capacity at each voltage dividing node is 2C.

Therefore, the voltage amplitude at each voltage dividing node is reduced by capacitive subdivision everyone half from the input node to an amplifier stage which receives the lowest control word bit. Therefore, it is possible to provide a variable gain driver which has the same working-effect as in Embodiments 1, 3, 4, and 5.

(Modified Example)

Figure 35:
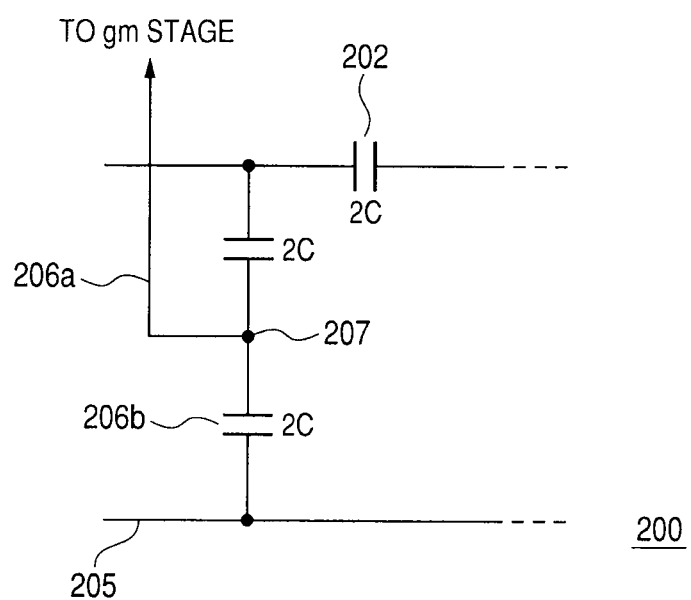
FIG. 35 is a drawing illustrating schematically a configuration of a ladder network in a modified example according to Embodiment 6 of the present invention.

FIG. 35 illustrates schematically a configuration of the principal part of a variable gain driver in a modified example according to Embodiment 6 of the present invention. In the configuration illustrated in FIG. 35, a series body of capacitive elements 206a and 206b of capacity 2C is used in place of the capacitive element 204 of capacity C. A connection node between these capacitive elements 206a and 206b is coupled to an input of the corresponding transconductance amplifier stage 43. The other configuration of the variable gain driver illustrated in FIG. 35 is the same as the configuration illustrated in FIG. 34, therefore, the same reference number is attached to the corresponding component, and the detailed explanation thereof is omitted.

In the configuration illustrated in FIG. 35, the combined capacity of the series body of the capacitive elements 206a and 206b is C; and a signal of which the amplitude is reduced every one half is transmitted sequentially to the internal voltage dividing node, in the same manner as in the configuration illustrated in FIG. 34. A voltage with an amplitude one half of the voltage at the corresponding voltage dividing node is transmitted to the connection node 207 by the capacitive subdivision of the capacitive elements 206a and 206b. Therefore, in the connection node 207, a voltage of which the voltage amplitude is reduced every one half is transmitted similarly. Accordingly, a transconductance amplifier stage is coupled in the same manner as in Embodiment 2 illustrated in FIG. 8.

In the configuration illustrated in FIG. 35, a resistor of the input part of the transconductance amplifier stage can be hidden by the capacitive element 206a to the voltage dividing node. Correspondingly, it is possible to reduce delay of signal propagation due to parasitic resistance of the input part of the transconductance amplifier stage and due to an RC delay circuit of the capacitive element 202, and to suppress phase fluctuation in switching the amplifier stages. The configuration illustrated in FIG. 34 is used combining with the configuration of any one Embodiment 2-Embodiment 5.

As described above, according to Embodiment 6 of the present invention, the ladder network which reduces signal amplitude is formed by the 2C-C ladder network, and it is possible to obtain the same effect as in Embodiments 1-5.

When the semiconductor device according to the present invention is applied to a mobile terminal which generates and transmits a transmitting signal according to a direct conversion system, without generating intermediate frequency (IF signal), it is possible to realize a communication terminal which has an excellent linearity in the gain control, a small occupied area, a low power consumption, and a high dynamic range.

What is claimed is:

1. A semiconductor device for signal amplification comprising:
   a ladder network including a plurality of cascade-coupled nodes to which an input signal supplied to an input node is transmitted, each node being weighted corresponding to the respective position in the ladder network and operable to generate a voltage of the correspondingly weighted input signal;

a plurality of first transconductance amplifier stages arranged corresponding to each node of the ladder network, each of the first transconductance amplifier stages being operable to convert the voltage generated at the corresponding node to a current and to transmit the current to an output signal line arranged in common to the first transconductance amplifier stages;

a logic control circuit operable to set the first transconductance amplifier stages to an enabled state selectively according to a control word;

a current source circuit operable to generate a constant current unchangeable in temperature and to supply the constant current to the first transconductance amplifier stages so as to specify operating current of the first transconductance amplifier stages;

a modulator circuit with a gain adjustable by a control signal, the modulator circuit operable to modulate a baseband signal to produce a modulated signal and to supply the modulated signal concerned to the ladder network as the input signal;

a replica modulator circuit having the same structure as the modulator circuit, being coupled fixedly with a coupling path of a switching stage, having a gain adjustable by the control signal, and operable to modulate a first voltage with a fixed voltage level in simulation;

at least one of replica amplifier having the same structure as the first transconductance amplifier stages and being operable to generate a signal corresponding to an output signal of the replica modulator circuit; and a differential amplifier circuit operable to generate the control signal by amplifying differentially the output signal of the replica amplifier and a second fixed voltage.

2. The semiconductor device for signal amplification according to claim 1,
wherein the modulator circuit includes:
a baseband signal input stage operable to receive the baseband signal;
a switching stage coupled to the baseband signal input stage and operable to switch over a transmission path of an output signal of the baseband signal input stage;
a gain control stage coupled to the switching stage and operable to adjust a gain of a signal transmitted from the switching stage and operable to transmit the signal to an output node, and
wherein the gain control stage, the switching stage, and the baseband signal input stage are coupled between the output node and the current source in a manner mutually stacked in vertical structure.

3. The semiconductor device for signal amplification according to claim 2,
wherein the replica amplifier includes a plurality of replica amplifiers arranged corresponding to each of the first transconductance amplifier stages, and
wherein the logic control circuit enables a replica amplifier arranged corresponding to the first transconductance amplifier stage which is in an enabled state and generates a current signal with the maximum amplitude among the first transconductance amplifier stages.

4. A semiconductor device for signal amplification comprising:
a ladder network including a plurality of cascade-coupled nodes to which an input signal supplied to an input node is transmitted, each node being weighted corresponding to the respective position in the ladder network and operable to generate a voltage of the correspondingly weighted input signal;
a plurality of first transconductance amplifier stages arranged corresponding to each node of the ladder network, each of the first transconductance amplifier stages being operable to convert the voltage generated at the corresponding node to a current and to transmit the current to an output signal line arranged in common to the first transconductance amplifier stages: and
a logic control circuit operable to set the first transconductance amplifier stages to an enabled state selectively according to a control word,
wherein the ladder network includes:
a plurality of first impedance components coupled in series to the input node receiving the input signal; and
a plurality of second impedance components arranged corresponding to the first impedance components and coupled to the corresponding first impedance component in parallel,
wherein each of the second impedance components has a first sub impedance component and a second sub impedance component coupled in series, and
wherein each transconductance amplifier stage receives a signal at a connection node between the corresponding first sub impedance component and the corresponding second sub impedance component.

5. A semiconductor device for signal amplification comprising:
a ladder network including a plurality of cascade-coupled nodes to which an input signal supplied to an input node is transmitted, each node being weighted corresponding to the respective position in the ladder network and operable to generate a voltage of the correspondingly weighted input signal;
a plurality of first transconductance amplifier stages arranged corresponding to each node of the ladder network, each of the first transconductance amplifier stages being operable to convert the voltage generated at the corresponding node to a current and to transmit the current to an output signal line arranged in common to the first transconductance amplifier stages:
a logic control circuit operable to set the first transconductance amplifier stages to an enabled state selectively according to a control word; and
at least one of second transconductance amplifier stage coupled to the input node and enabled selectively according to the control word, and in an enabled state, operable to transmit a current corresponding to an input signal at the input node to the output signal line,
wherein the second transconductance amplifier stage has different transconductance from the first transconductance amplifier stage.

* * * * *